US012625211B2

(12) United States Patent
Xiang et al.

(10) Patent No.: US 12,625,211 B2
(45) Date of Patent: May 12, 2026

(54) MODEL-BASED RECONSTRUCTION FOR LOOPING-STAR PULSE SEQUENCES IN MRI

(71) Applicant: REGENTS OF THE UNIVERSITY OF MICHIGAN, Ann Arbor, MI (US)

(72) Inventors: Haowei Xiang, Ann Arbor, MI (US); Jeffrey Allen Fessler, Ann Arbor, MI (US); Douglas Clair Noll, Ann Arbor, MI (US)

(73) Assignee: REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 206 days.

(21) Appl. No.: 18/138,211

(22) Filed: Apr. 24, 2023

(65) Prior Publication Data

US 2023/0366966 A1 Nov. 16, 2023

Related U.S. Application Data

(60) Provisional application No. 63/333,831, filed on Apr. 22, 2022.

(51) Int. Cl.
G01R 33/56 (2006.01)
G01R 33/385 (2006.01)
(Continued)

(52) U.S. Cl.
CPC ....... G01R 33/5608 (2013.01); G01R 33/385 (2013.01); G01R 33/4818 (2013.01); G01R 33/50 (2013.01)

(58) Field of Classification Search
CPC .............. G01R 33/385; G01R 33/4806; G01R 33/4818; G01R 33/4826; G01R 33/50;
(Continued)

(56) References Cited

U.S. PATENT DOCUMENTS

| | | | | | |
|---|---|---|---|---|---|
| 5,327,088 | A | * | 7/1994 | Pipe ..................... | G01R 33/561 |
| | | | | | 324/309 |
| 7,023,207 | B1 | * | 4/2006 | Gaddipati .......... | G01R 33/4824 |
| | | | | | 324/309 |

(Continued)

OTHER PUBLICATIONS

Alibek et al., Acoustic noise reduction in MRI using Silent Scan: an initial experience, Diagn. Interv. Radiol., 20(4):360-3 (2014).
(Continued)

*Primary Examiner* — Judy Nguyen
*Assistant Examiner* — Adam S Clarke
(74) *Attorney, Agent, or Firm* — MARSHALL, GERSTEIN & BORUN LLP; William J. Samore

(57) ABSTRACT

The following relates generally to improved techniques for magnetic resonance imaging (MRI). In particular, the following relates to improving techniques of data acquisition and image reconstruction in relation to the "looping star" pulse sequence, which was developed to reduce acoustic noise. For example, techniques disclosed herein address the problem that looping star pulse sequence suffers from the overlapping echo effect. For instance, some implementations build echo-in and echo-out signal matrixes, and then sum the matrices to create a system matrix.

22 Claims, 25 Drawing Sheets
(4 of 25 Drawing Sheet(s) Filed in Color)

(51) Int. Cl.
  *G01R 33/48* (2006.01)
  *G01R 33/50* (2006.01)
(58) Field of Classification Search
  CPC ............ G01R 33/5602; G01R 33/5608; G01R
  33/565; G01R 33/5659
  See application file for complete search history.

(56)     References Cited

U.S. PATENT DOCUMENTS

| | | | |
|---|---|---|---|
| 9,726,742 | B2 | 8/2017 | Moeller et al. |
| 10,088,539 | B2 | 10/2018 | Wiesinger et al. |
| 10,191,133 | B2 | 1/2019 | Beck et al. |
| 2019/0079154 | A1 | 3/2019 | Du et al. |
| 2019/0369185 | A1 | 12/2019 | Setsompop et al. |
| 2021/0088612 | A1 | 3/2021 | Wiesinger et al. |
| 2021/0118203 | A1* | 4/2021 | Ding .................. G01R 33/5614 |
| 2022/0214416 | A1* | 7/2022 | Krishnamoorthy ......................... |
| | | | G01R 33/5616 |
| 2023/0236271 | A1* | 7/2023 | Fessler ............... G01R 33/5608 |
| | | | 324/309 |

OTHER PUBLICATIONS

Chan et al., Temporal stability of adaptive 3D radial MRI using multidimensional golden means, Magn. Reson. Med., 61(2):354-63 (2009).

Damestani et al., Coherence-resolved looping star—improvements for silent multi-gradient echo structural and functional neuroimaging, ISMRM & SMRT Annual Meeting & Experience (2021).

Damestani et al., Revealing the mechanisms behind novel auditory stimuli discrimination: An evaluation of silent functional MRI using looping star, Hum Brain Mapp, 42(9):2833-50 (Jun. 2021).

Dionisio-Parra et al., Looping Star fMRI in Cognitive Tasks and Resting State, Mag. Reson. Imaging, 52(3):739-51 (Sep. 2020).

Edelstein et al., Active-passive gradient shielding for MRI acoustic noise reduction, Magnetic Resonance in Medicine, 53(5):1013-7 (2005).

Fessler, Model-based image reconstruction for MRI, IEEE Signal Process Mag., 27(4):81-89 (2010).

Gorski et al., Biconvex sets and optimization with biconvex functions: a survey and extensions, Mathematical Methods of Operations Research, 66(3):373-407 (2007).

Grodzki et al., Correcting slide selectivity in hard pulse sequences, J. Magn. Reson., 214(1):61-67 (2012).

Guo et al., High-resolution oscillating steady-state fMRI using patch-tensor low-rank reconstruction, IEEE Trans. Med. Imaging, 39(12):4357-68 (2020).

Hennel et al., "Silent" MRI with soft gradient pulses, Magnetic Resonance in Medicine, 42(1):6-10 (1999).

Kim et al., Adaptive restart of the optimized gradient method for convex optimization, Journal of Optimization Theory and Applications, 178(1):240-63 (2018).

Leynes et al., Extreme looping star: Quiet fMRI at high spatiotemporal resolution, ISMRM & SMRT Annual Meeting & Exhibition (May 15-20, 2021).

Lingala et al., Accelerated dynamic MRI exploiting sparsity and low-rank structure: k-t SLR, IEEE Trans. Med. Imaging, 30(5):1042-54 (2011).

Ljungberg et al., Silent zero TE MR neuroimaging: current state-of-the-art and future directions, Prog. Nucl. Magn. Reson. Spectrosc., 123:73-93 (Apr. 2021).

Madore et al., Unaliasing by fourier-encoding the overlaps using the temporal dimension (UNFOLD), applied to cardiac imaging and fMRI, Magn. Reson. Med., 42(5):813-28 (1999).

Nielsen et al., TOPPE: A framework for rapid prototyping of MR pulse sequences, Magn. Reson. Med., 79(6):3128-34 (2018).

Pruessmann et al., Advances in sensitivity encoding with arbitrary k-space trajectories, Magn. Reson. Med., 56(4):638-51 (2001).

Sumpf et al., Model-based nonlinear inverse reconstruction for T2 mapping using highly undersampled spin-echo MRI, J. Magn. Reson. Imaging, 34(2):420-8 (2011).

Sutton et al., Fast, iterative image reconstruction for MRI in the presence of field inhomogeneities, IEEE Trans. Med. Imaging, 22(2):178-88 (2003).

Talavage et al., Quantitative assessment of auditory cortex responses induced by imager acoustic noise, Human Brain Mapping, 7(2):79-88 (1999).

Tomasi et al., fMRI-acoustic noise alters brain activation during working memory tasks, Neuroimage, 27(2):377-86 (2005).

Weiger et al., MRI with zero echo time: hard versus sweep pulse excitation, Magn. Reson. Med., 66(2):379-89 (2011).

Wiesinger et al., Looping star, Magn. Reson. Med., 81(1):57-68 (2019).

Xiang et al., Model-based image reconstruction in looping-star MRI, Abstract, Joint Annual Meeting ISMRM-ESMRMB, London, England, May 7-12, 2023.

Zhao et al., Image reconstruction from highly undersampled (k, t)-space data with joint partial separability and sparsity constraints, IEEE Trans Med Imaging, 31(9):1809-20 (2012).

* cited by examiner

1300

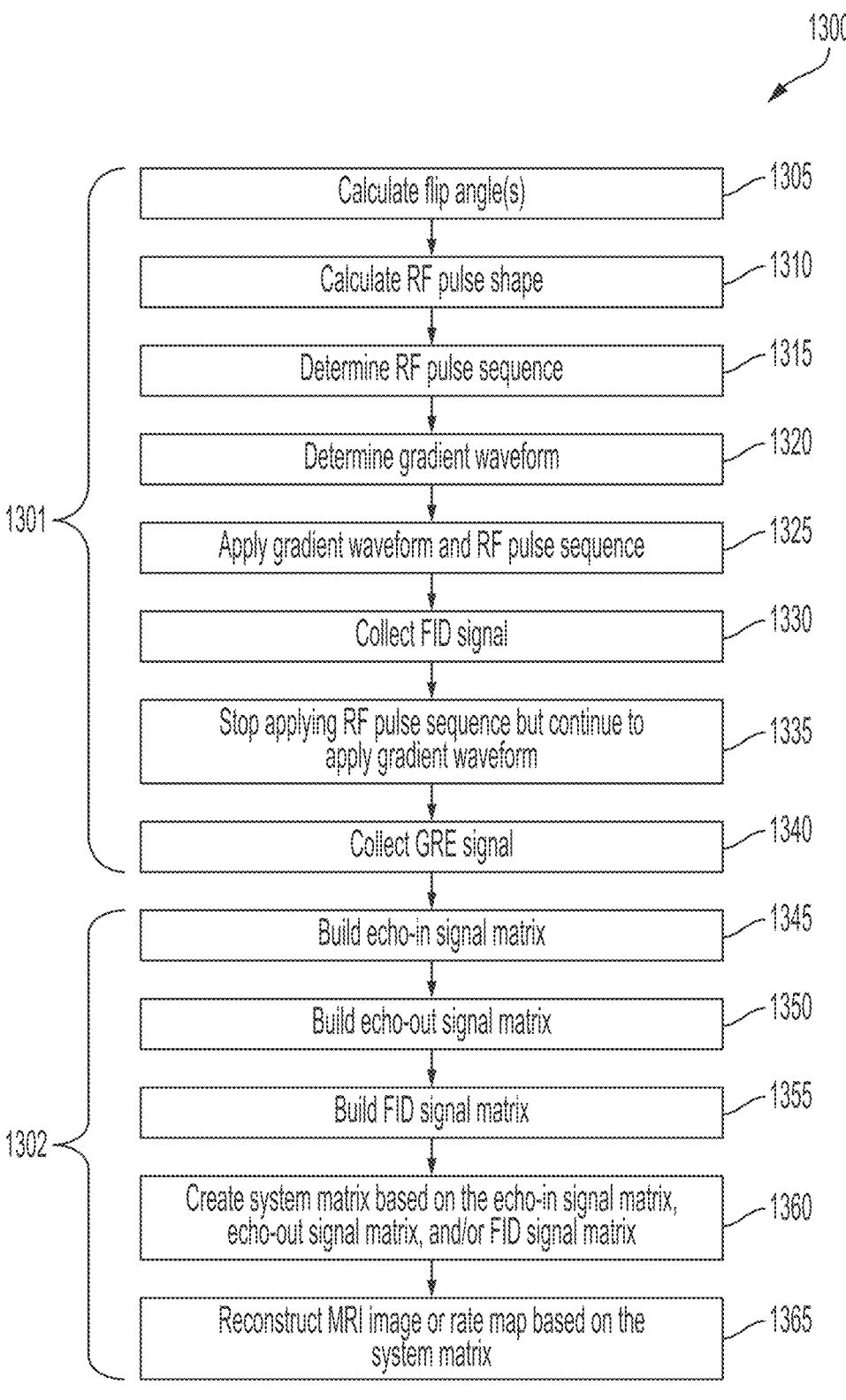

1301 {
  Calculate flip angle(s) — 1305
  Calculate RF pulse shape — 1310
  Determine RF pulse sequence — 1315
  Determine gradient waveform — 1320
  Apply gradient waveform and RF pulse sequence — 1325
  Collect FID signal — 1330
  Stop applying RF pulse sequence but continue to apply gradient waveform — 1335
  Collect GRE signal — 1340
}

1302 {
  Build echo-in signal matrix — 1345
  Build echo-out signal matrix — 1350
  Build FID signal matrix — 1355
  Create system matrix based on the echo-in signal matrix, echo-out signal matrix, and/or FID signal matrix — 1360
  Reconstruct MRI image or rate map based on the system matrix — 1365
}

FIG. 13

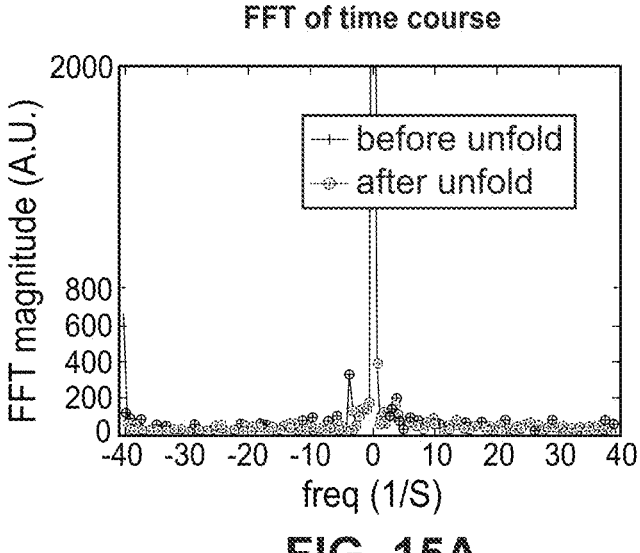
FIG. 15A
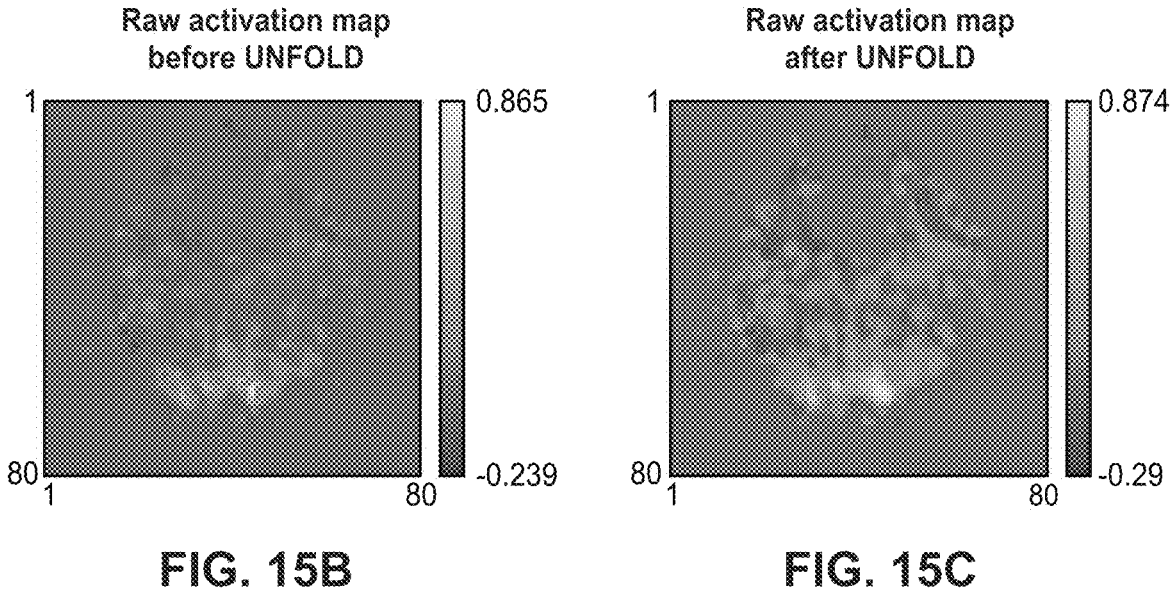
FIG. 15B                    FIG. 15C

MODEL-BASED RECONSTRUCTION FOR LOOPING-STAR PULSE SEQUENCES IN MRI

CROSS REFERENCE TO RELATED APPLICATIONS

This application claims the benefit of U.S. Provisional Application No. 63/333,831, entitled "Model-Based Reconstruction For Looping-Star Pulse Sequences In MRI" (filed Apr. 22, 2022), the entirety of which is incorporated by reference herein.

STATEMENT OF GOVERNMENT INTEREST

This invention was made with government support under EB023618 awarded by the National Institutes of Health. The government has certain rights in the invention.

BACKGROUND

In modern magnetic resonance imaging (MRI) systems, loud acoustic noises are generated from Lorentz forces caused by rapidly changing currents in the magnetic field gradient coils. To reduce these loud noises, a magnetic pulse sequence, known as the "looping star" pulse sequence, was developed. However, the looping star pulse sequence has several drawbacks. For example, the looping star pulse sequence suffers from an overlapping echo effect, which comes from signals from multiple excitation pulses being simultaneously present while looping through k-space locations.

The systems and methods disclosed herein provide solutions to this problem and others.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one aspect, a method for use in $$T_2^*$$

-weighted magnetic resonance imaging (MRI) image reconstruction may be provided. The method may include: (1) collecting, via one or more processors, a plurality of echo signals, the plurality of echo signals being created by a MRI machine: (i) applying a gradient magnetic field to a subject, and (ii) applying a sequence of radio frequency (RF) pulses to the subject, wherein the plurality of echo signals are collected in a phase during which the sequence of RF pulses are not being applied to the subject; (2) building, via the one or more processors, an echo-in signal matrix based on k-space sampling locations; (3) building, via the one or more processors, an echo-out signal matrix based on the k-space sampling locations; (4) summing, via the one or more processors, the echo-in signal matrix with the echo-out signal matrix to create a system matrix that models overlapping echoes; and (5) reconstructing, via the one or more processors, a MRI image and/or rate map based on the system matrix, and the collected plurality of echo signals.

In another aspect, a device for use in $$T_2^*$$

weighted magnetic resonance imaging (MRI) image reconstruction may be provided. The device may include one or more processors configured to: (1) collect a plurality echo signals, the plurality of echo signals being a plurality of signals that are created by a MRI machine: (i) applying a gradient magnetic field to a subject, and (ii) applying a sequence of radio frequency (RF) pulses to the subject, wherein the one or more processors are further configured to collect in a phase during which the sequence of RF pulses are not being applied to the subject; (2) build an echo-in signal matrix based on k-space sampling locations; (3) build an echo-out signal matrix based on the k-space sampling locations; (4) sum the echo-in signal matrix with the echo-out signal matrix to create a system matrix that models overlapping echoes; and (5) reconstruct a MRI image and/or rate map based on the system matrix, and the collected plurality of echo signals.

In yet another aspect, a system for use in $$T_2^*$$

-weighted magnetic resonance imaging (MRI) image reconstruction may be provided. The system may include: (a) one or more processors; (b) a gradient coil; (c) at least one radio frequency (RF) transmit coil; (d) at least one RF receive coil; and (e) one or more memories coupled to the one or more processors. The one or more memories may include computer executable instructions stored therein that, when executed by the one or more processors, may cause the one or more processors to: (1) collect a plurality of echo signals, the plurality of echo signals being a plurality of signals that are created by a MRI machine: (i) applying a gradient magnetic field to a subject, and (ii) applying a sequence of RF pulses to the subject, wherein the one or more memories including computer executable instructions stored therein that, when executed by the one or more processors, further cause the one or more processors to collect in a phase during which the sequence of RF pulses are not being applied to the subject; (2) build an echo-in signal matrix based on k-space sampling locations; (3) build an echo-out signal matrix based on the k-space sampling locations; (4) sum the echo-in signal matrix with the echo-out signal matrix to create a system matrix that models overlapping echoes; and (5) reconstruct a MRI image and/or rate map based on the system matrix, and the collected plurality of echo signals.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

maps.

Figures 6A, 6B:
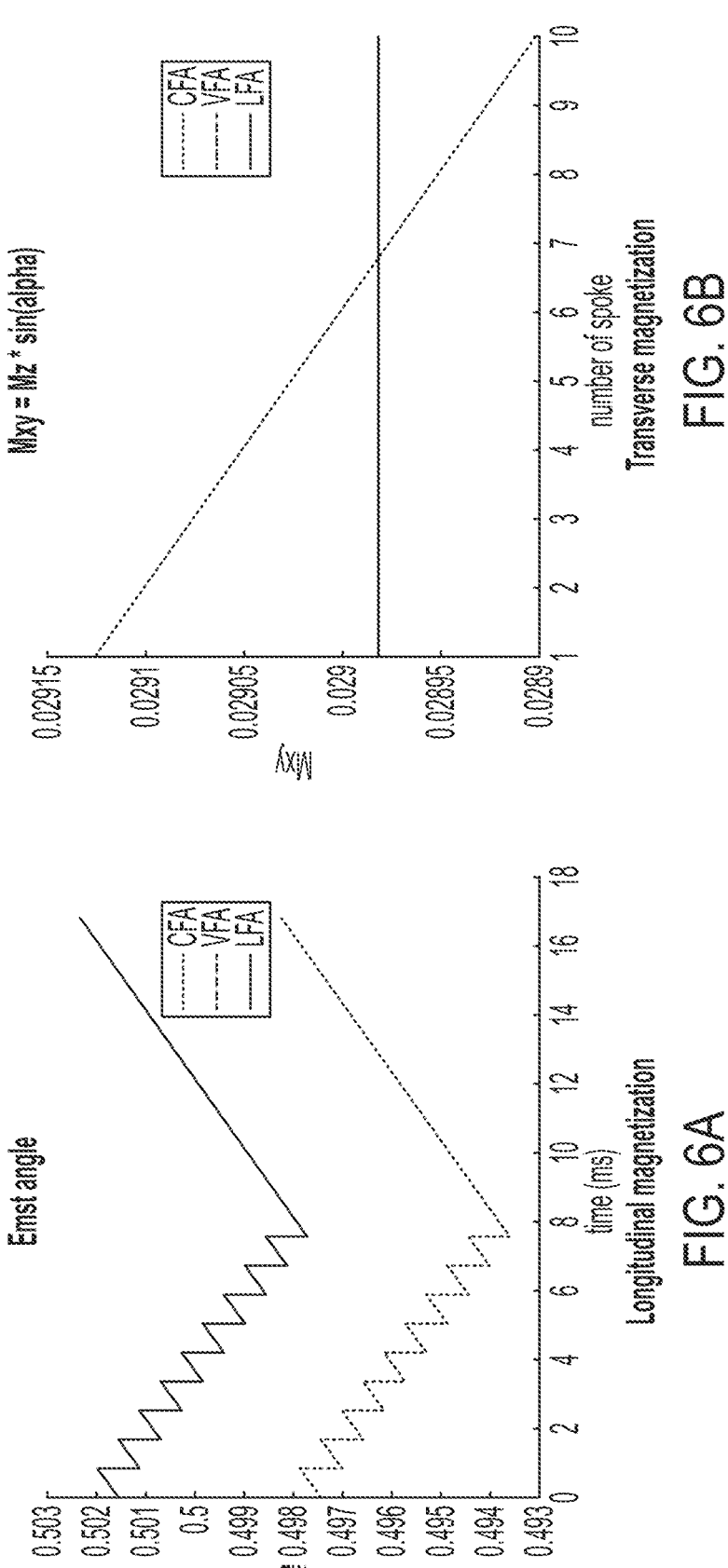

FIG. 6A shows an example simulated longitudinal magnetization using different flip angle schemes.

FIG. 6B shows an example transverse magnetization using different flip angle schemes.

Figures 7A, 7B, 7C:
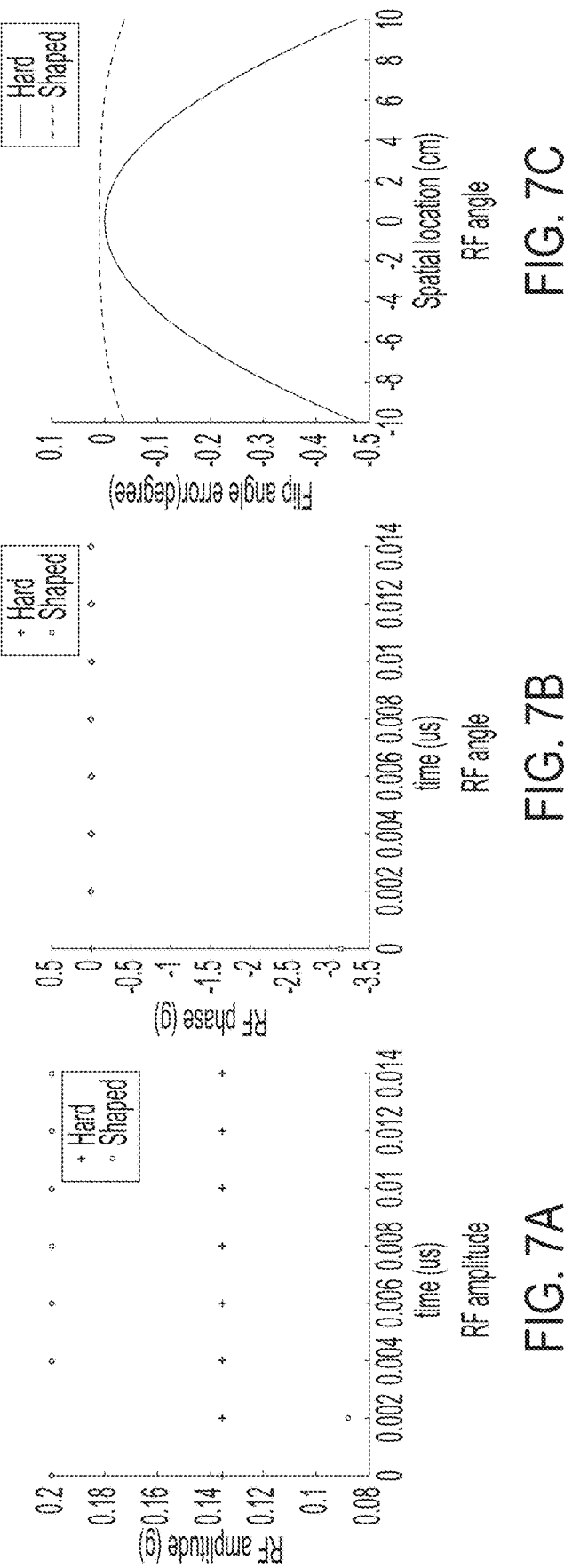

FIGS. 7A-7C illustrate an example simulation of an optimized (e.g., shaped) RF pulse.

Figure 8:
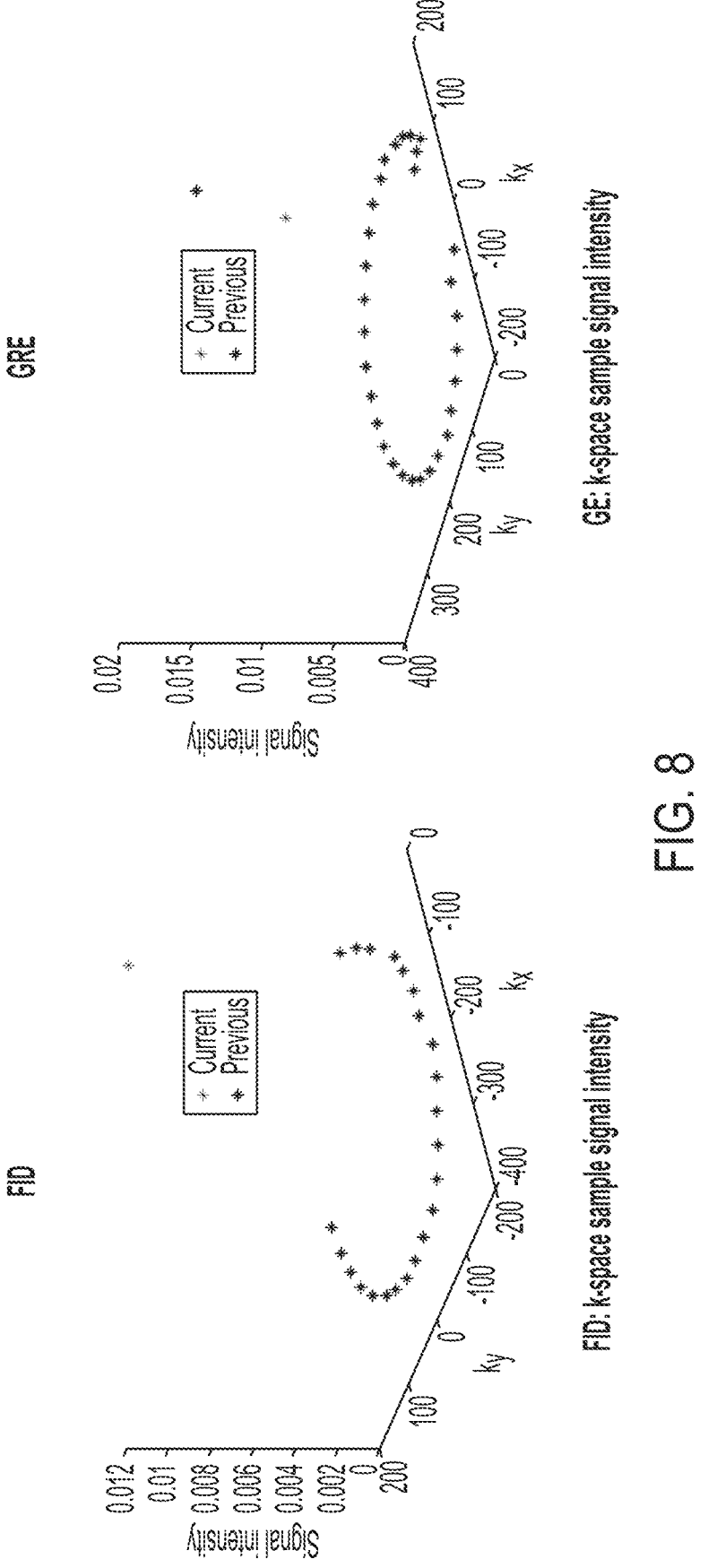

FIG. 8 illustrates example k-space locations and $$T_2^*$$

decay.

Figure 9:
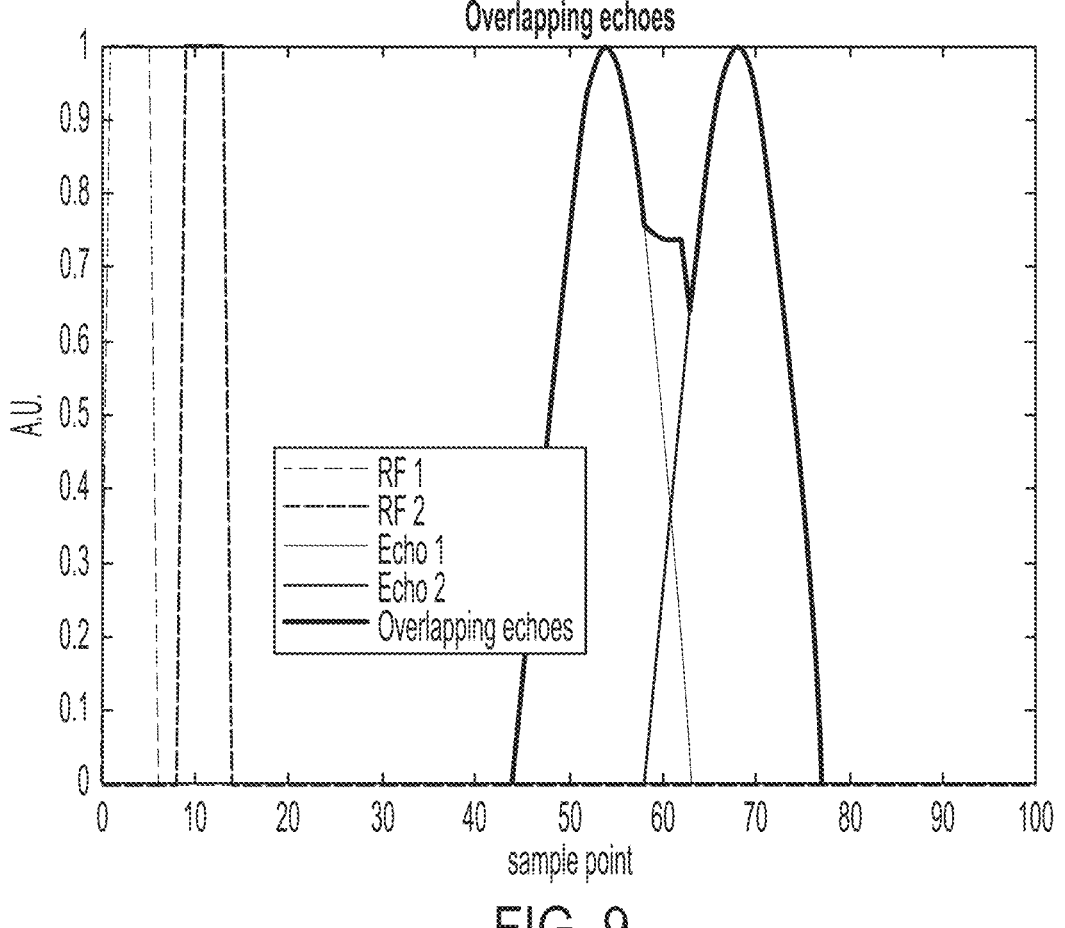

FIG. 9 illustrates an example of overlapping echoes involving two RF pulses.

Figure 10A:
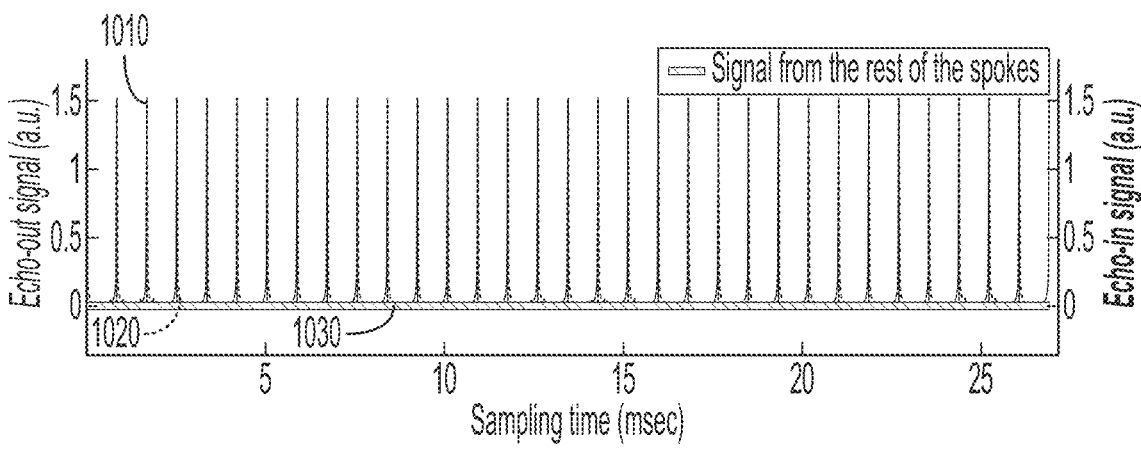
Figure 10B:
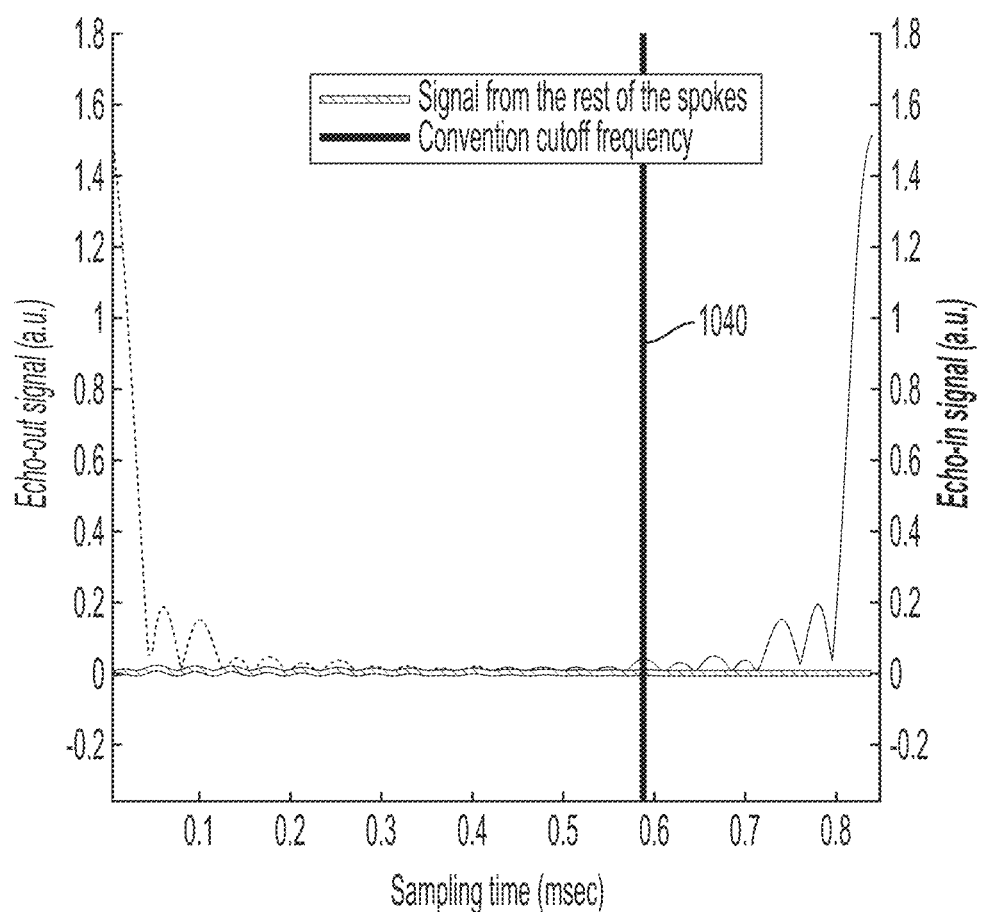
Figure 10C:
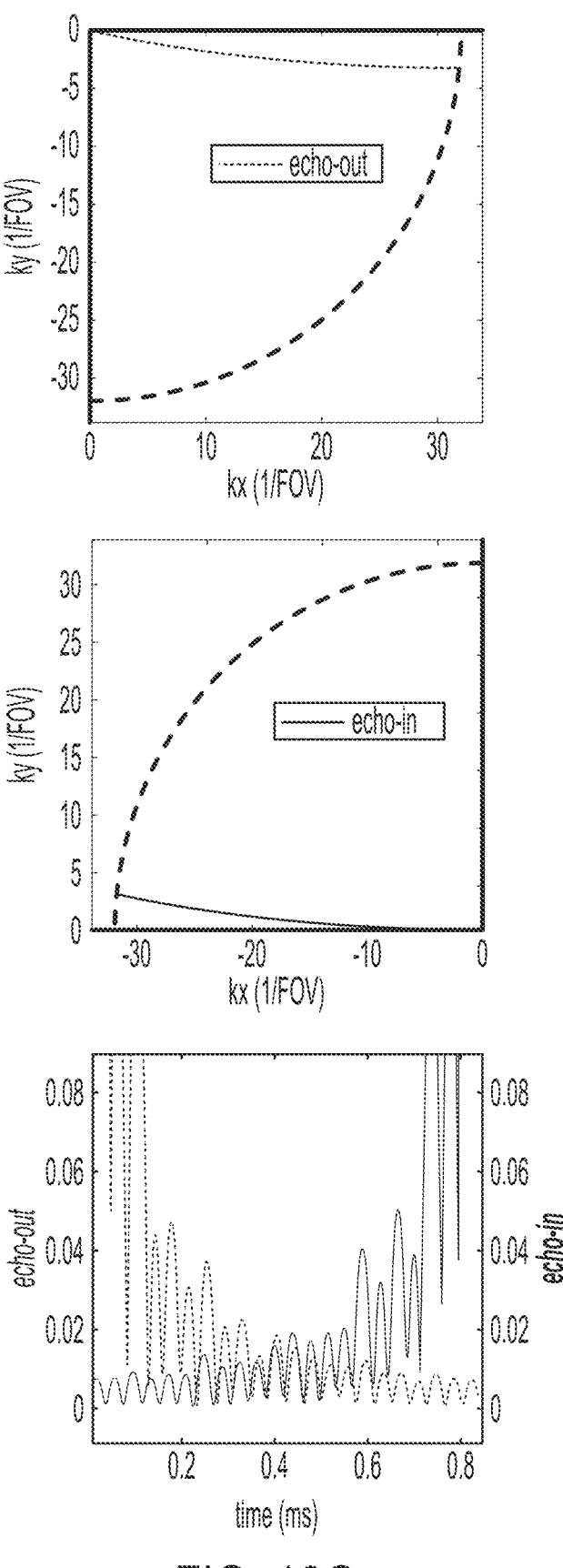

FIG. 10A illustrates another example of overlapping echoes. FIGS. 10B and 10C illustrate zoomed-in portions of FIG. 10A.

Figure 11:
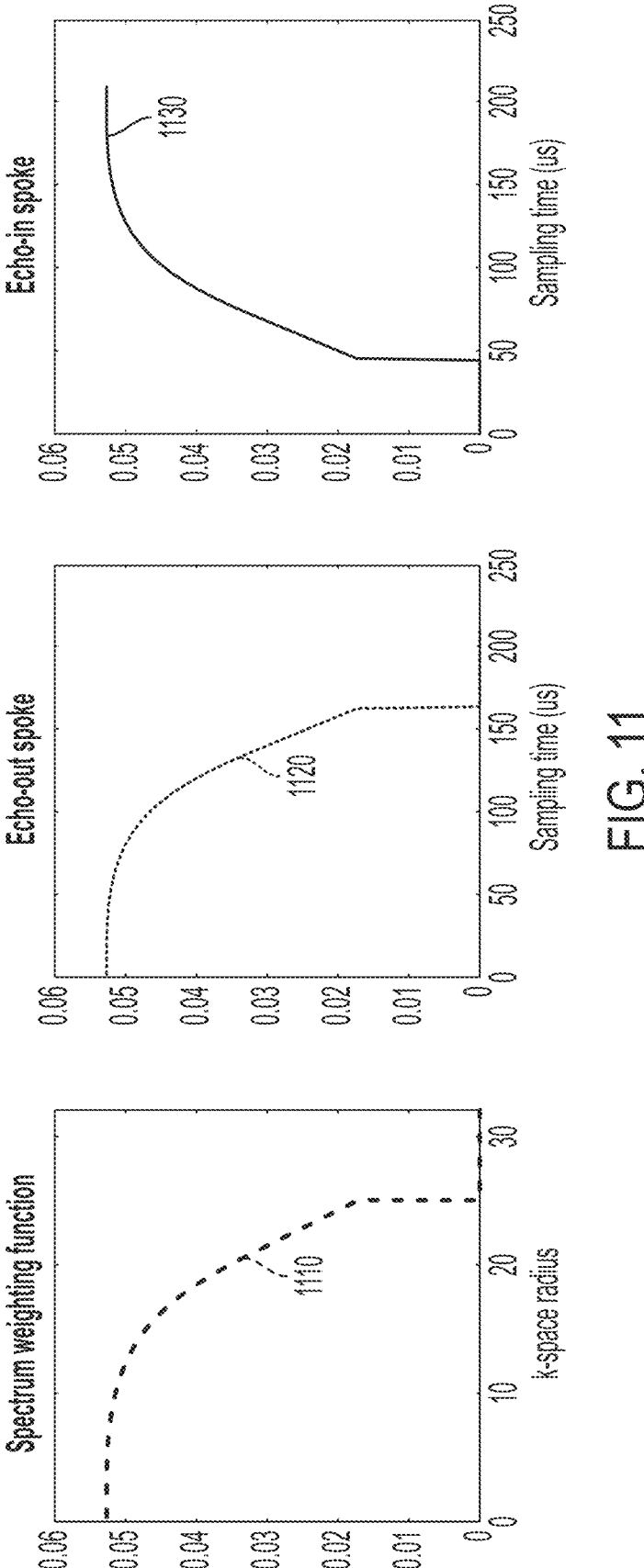

FIG. 11 illustrates example weighting functions to be used for image reconstruction.

Figure 12:
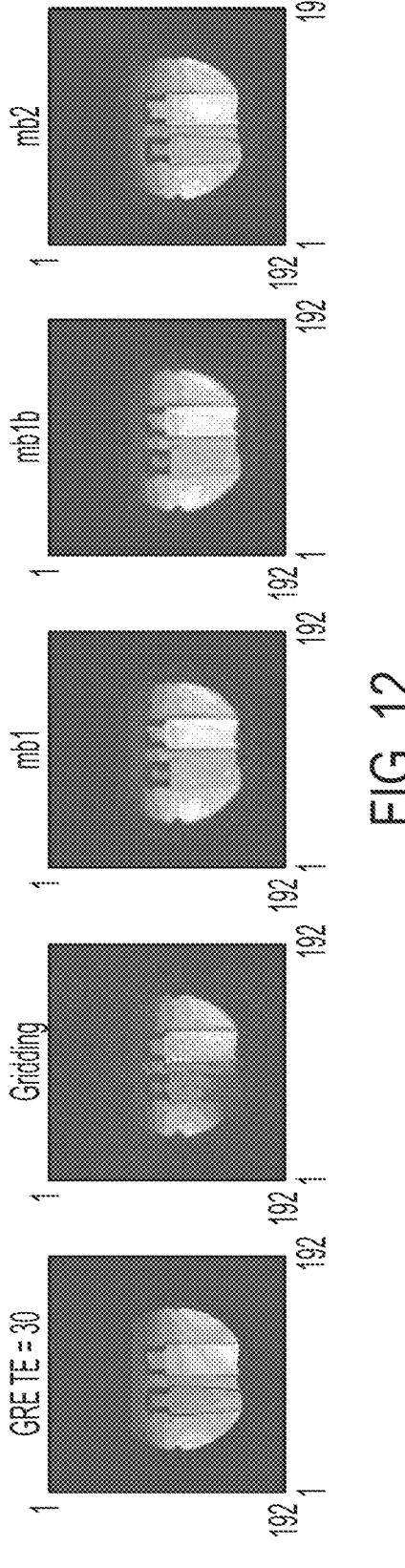

FIG. 12 shows an example reconstruction using a high-resolution looping star protocol.

FIG. 13 shows an overview of the acquisition and reconstruction process.

Figures 14A, 14B, 14C:
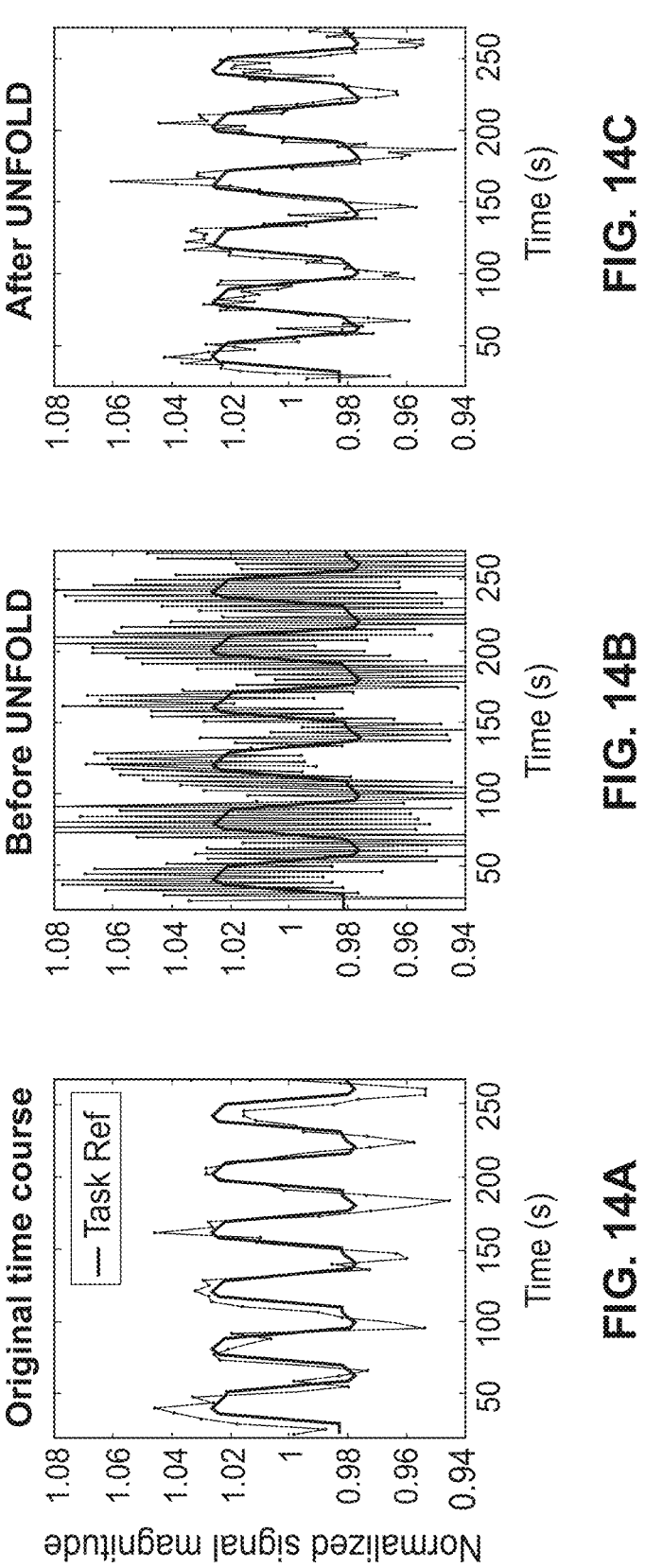

FIGS. 14A, 14B, and 14C show the time series of a looping-star fMRI task. More particularly, FIG. 14A shows the time course from the original looping-star with low temporal resolution; FIG. 14B shows the overlapping echo effect from the looping-star with high temporal resolution before UNFOLD ("unaliasing by Fourier-encoding the overlaps in the temporal dimension") is applied; and FIG. 14C shows the effects of applying UNFOLD and corresponds to FIG. 14B.

FIG. 15A shows the fast Fourier transform (FFT) of the time course of a typical activated voxel.

FIG. 15B shows a raw activation map before applying UNFOLD.

FIG. 15C shows the activation map corresponding to FIG. 15B after applying UNFOLD.

Figures 16A, 16B, 16C:
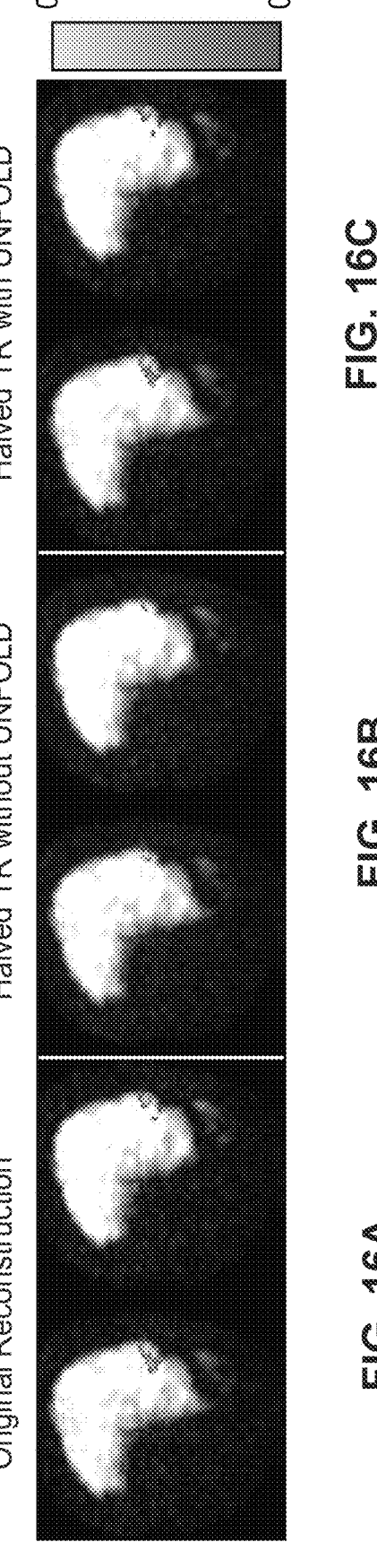

FIG. 16A shows an original frame-wise reconstruction.

FIG. 16B shows a halved volume repetition time (TR) of the data of FIG. 16A without UNFOLD applied.

FIG. 16C shows a halved TR of the data of FIG. 16A with UNFOLD applied.

Figures 17A, 17B, 17C:
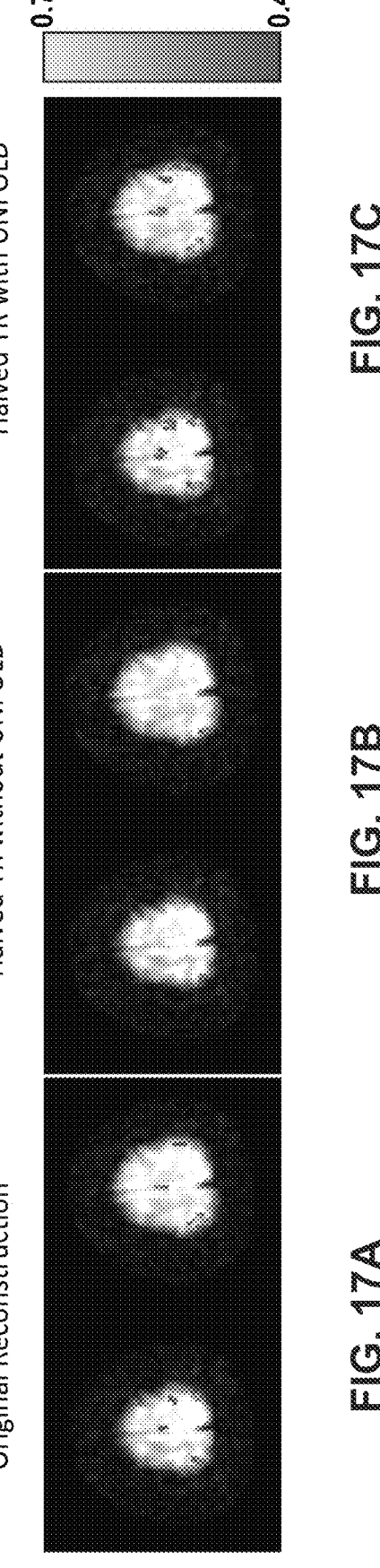

FIGS. 17A, 17B, 17C show activation maps for example finger-tapping tasks. More particularly, FIG. 17A shows an original frame-wise reconstruction; FIG. 17B shows a halved volume TR of the data of FIG. 17A without UNFOLD; and FIG. 17C shows a halved TR volume of the data of FIG. 17A with UNFOLD applied.

Figure 18:
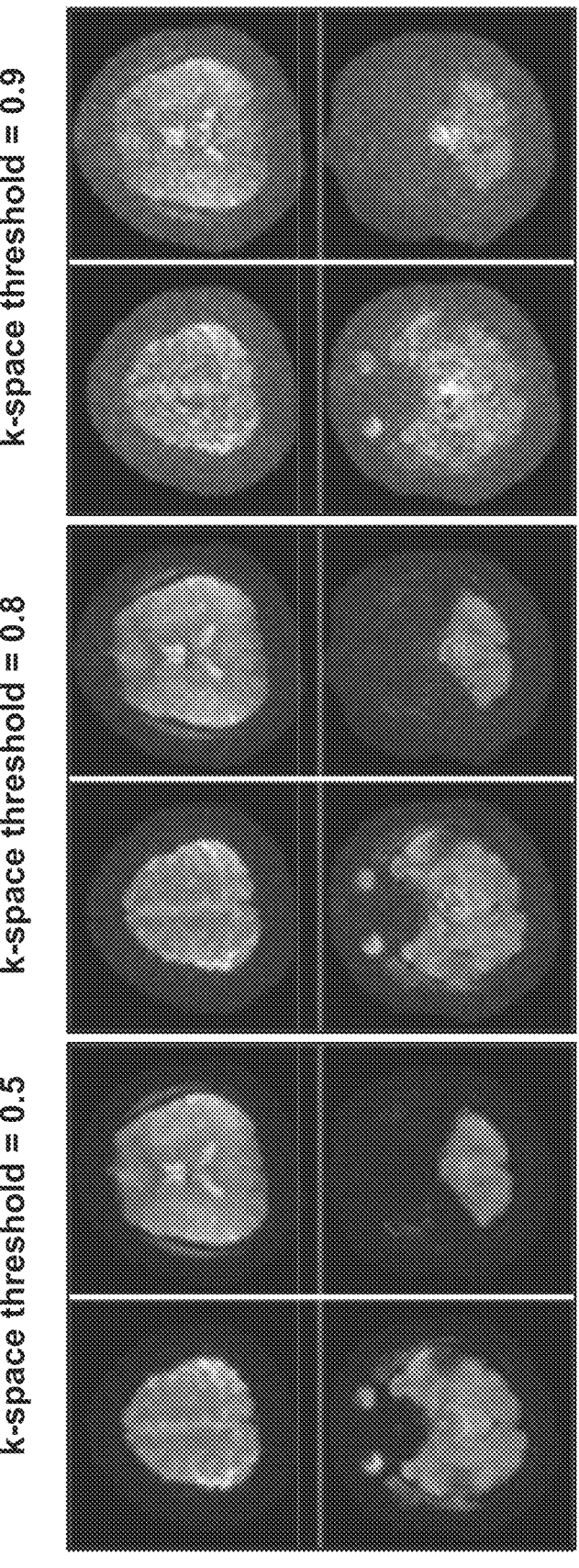

FIG. 18 illustrates example overlapping echo artifact from the conventional gridding methods.

Figures 19A, 19B, 19C, 19D:
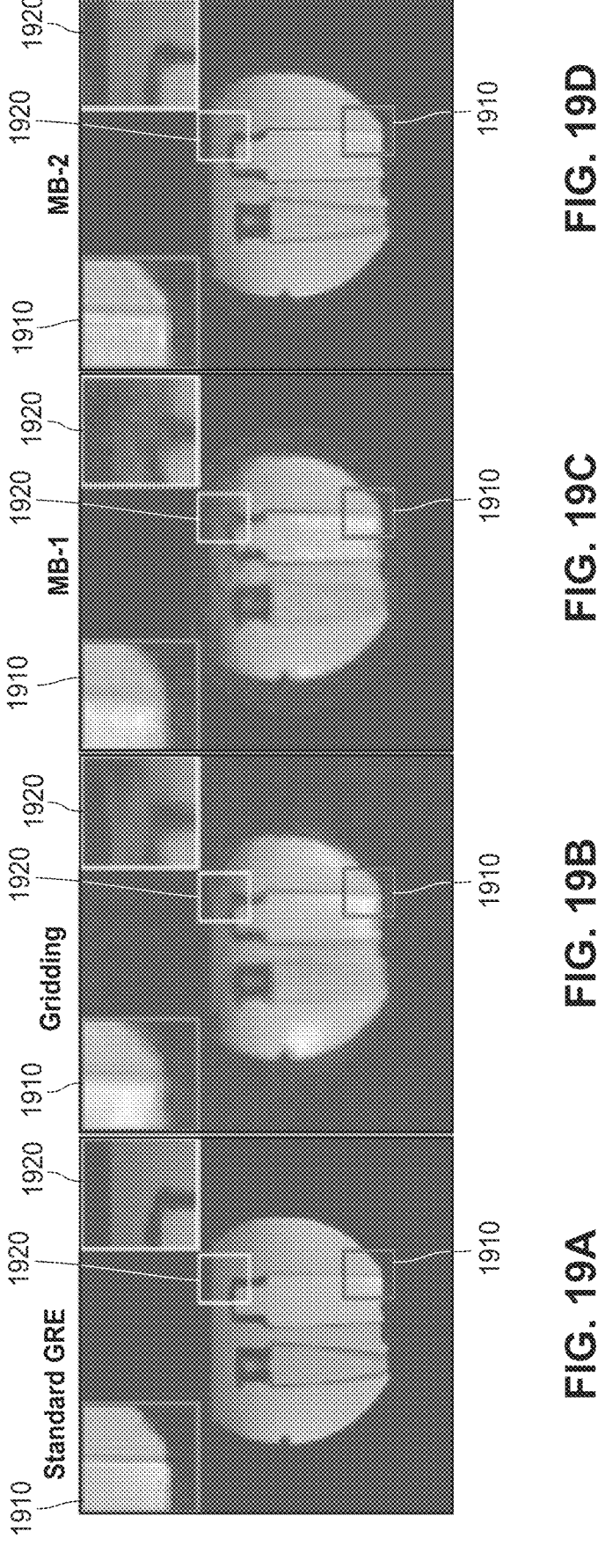

FIG. 19A-19D depict hi-resolution looping-star reconstruction in a phantom study. More particularly, FIG. 19A depicts standard $$T_2^*$$

-weighted GRE. FIG. 19B depicts gridding reconstruction with density compensation function. FIG. 19C depicts MB-1 without overlapping echo modeling. FIG. 19D depicts MB-2 with overlapping echo modeling.

Figure 20:
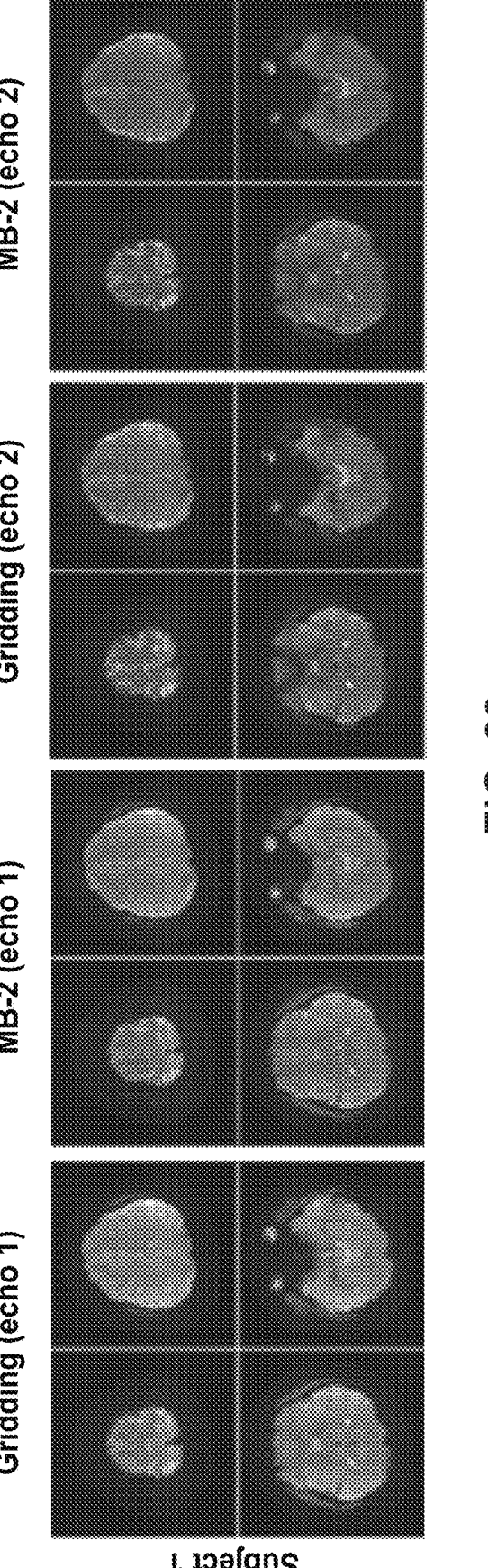

FIG. 20 shows an example reconstruction for a human brain scan in a representative example subject using the high-resolution protocol.

Figure 21:
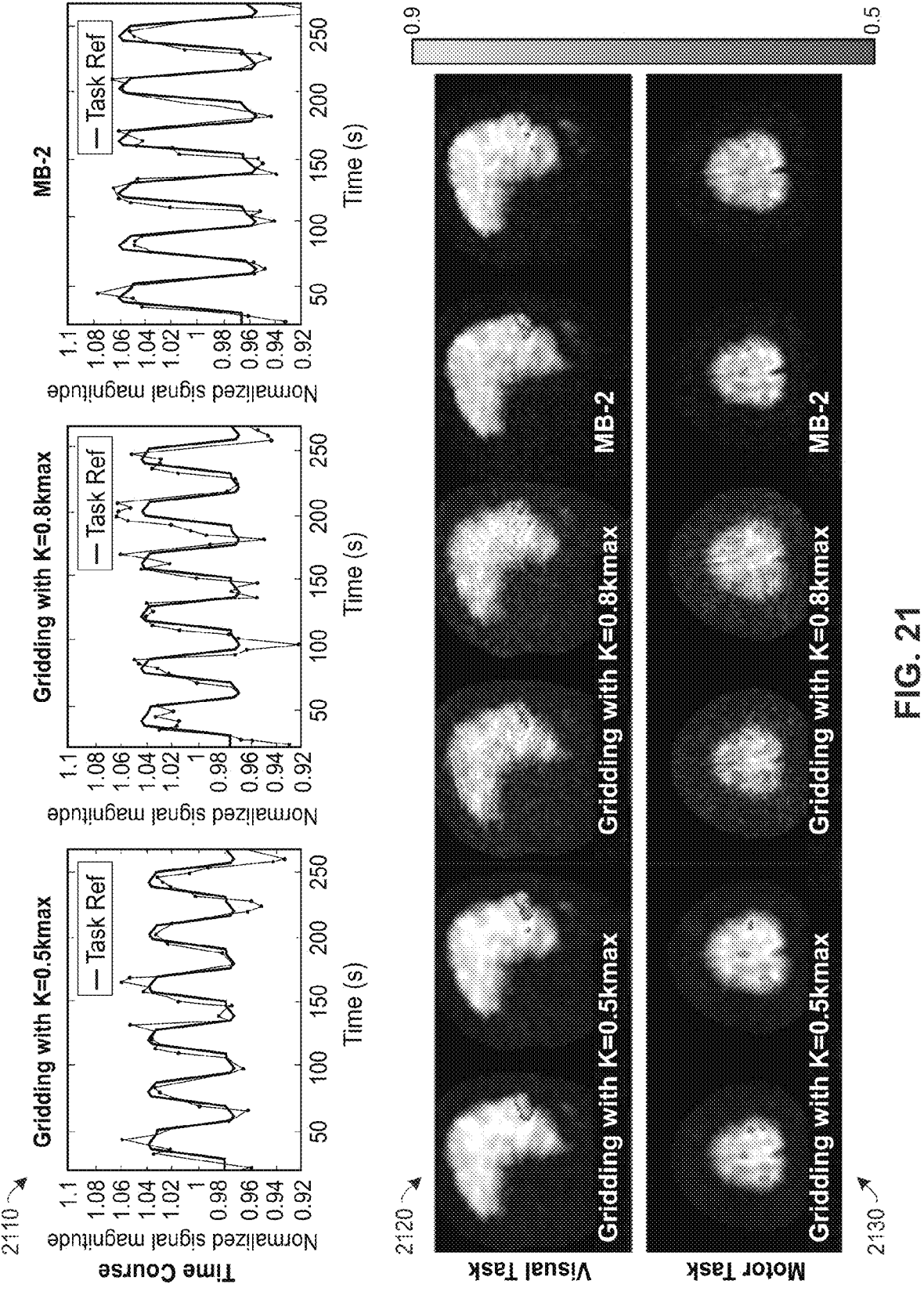

FIG. 21 shows the activation map and time course for the finger-tapping test in a typical subject.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

DETAILED DESCRIPTION

The present embodiments relate to, inter alia, improved techniques for magnetic resonance imaging (MRI). More particularly, the following relates to improving techniques of data acquisition and image reconstruction in relation to the "looping star" pulse sequence, which was developed to reduce acoustic noise. [Florian Wiesinger, Anne Menini, and Ana Beatriz Solana. Looping star. Magnetic resonance in medicine, 81(1):57-68, 2019].

Overview and Example System

Figure 1:
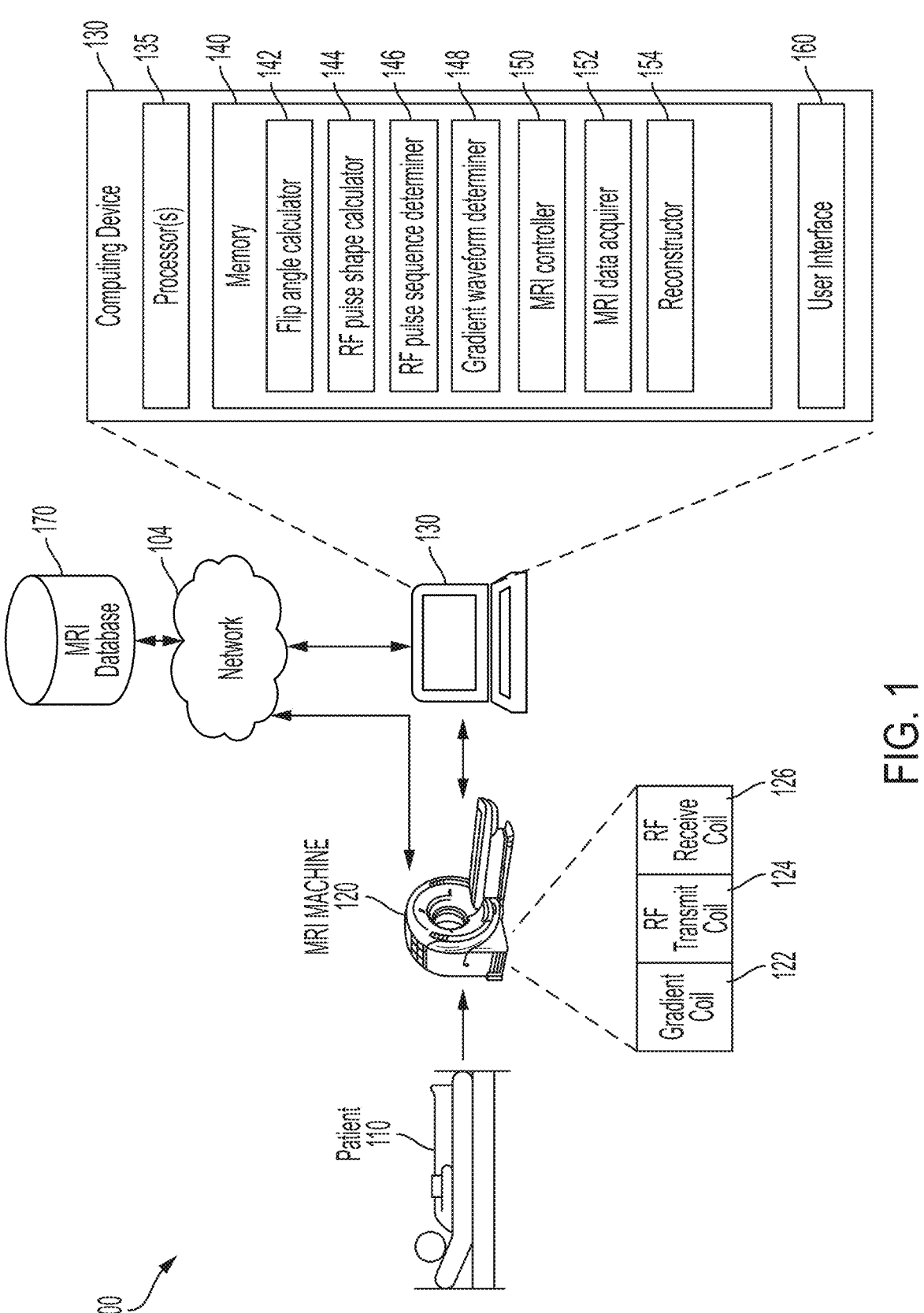
FIG. 1 shows an example MRI system in accordance with the techniques described herein.

By way of a brief overview and illustrative example, FIG. 1 shows an example MRI system 100, including patient/subject 110 entering a MRI machine 120. The MRI machine 120 may produce k-space data that is analyzed and processed by the computing device 130. For example, the MRI machine 120 (and/or the one or more processors 135) may control the gradient coil 122, the RF transmit coil 124 and the RF receive coil 126 to produce the k-space data. It should be understood that although the example of FIG. 1 illustrates one gradient coil 122, one RF transmit coil 124, and one RF receive coil 126, any number of gradient coils 122, RF transmit coils 124 and/or RF receive coils 126 may be used.

As is understood in the art, the k-space data may comprise a grid of raw data, in a form such as $s(k_x, k_y, k_z)$, acquired directly from the MR signal. Further, the k-space data may comprise an array of numbers corresponding to certain spatial frequencies (e.g., a number of wave cycles per unit distance) in the MR image. As is further understood in the art, the k-space data may be converted to an MR image using a Fourier Transform. Each point in k-space includes spatial frequency and phase information about every point (e.g., pixel) in the final MR image; thus, each point in k-space maps to every point in the final MR image.

Figure 2A:
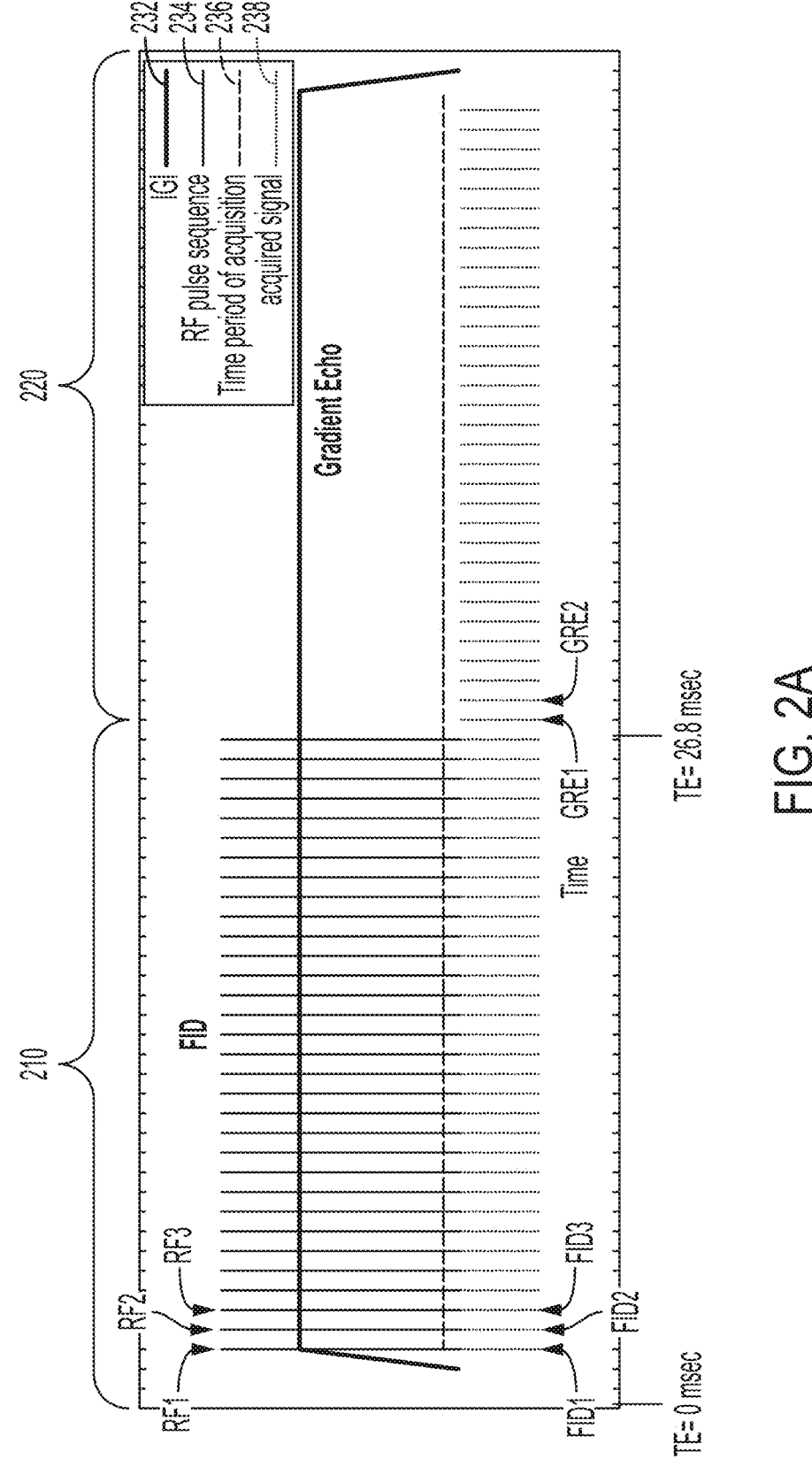
FIG. 2A illustrates an example pulse sequence diagram for looping-star fMRI.
Figures 2B, 2C:
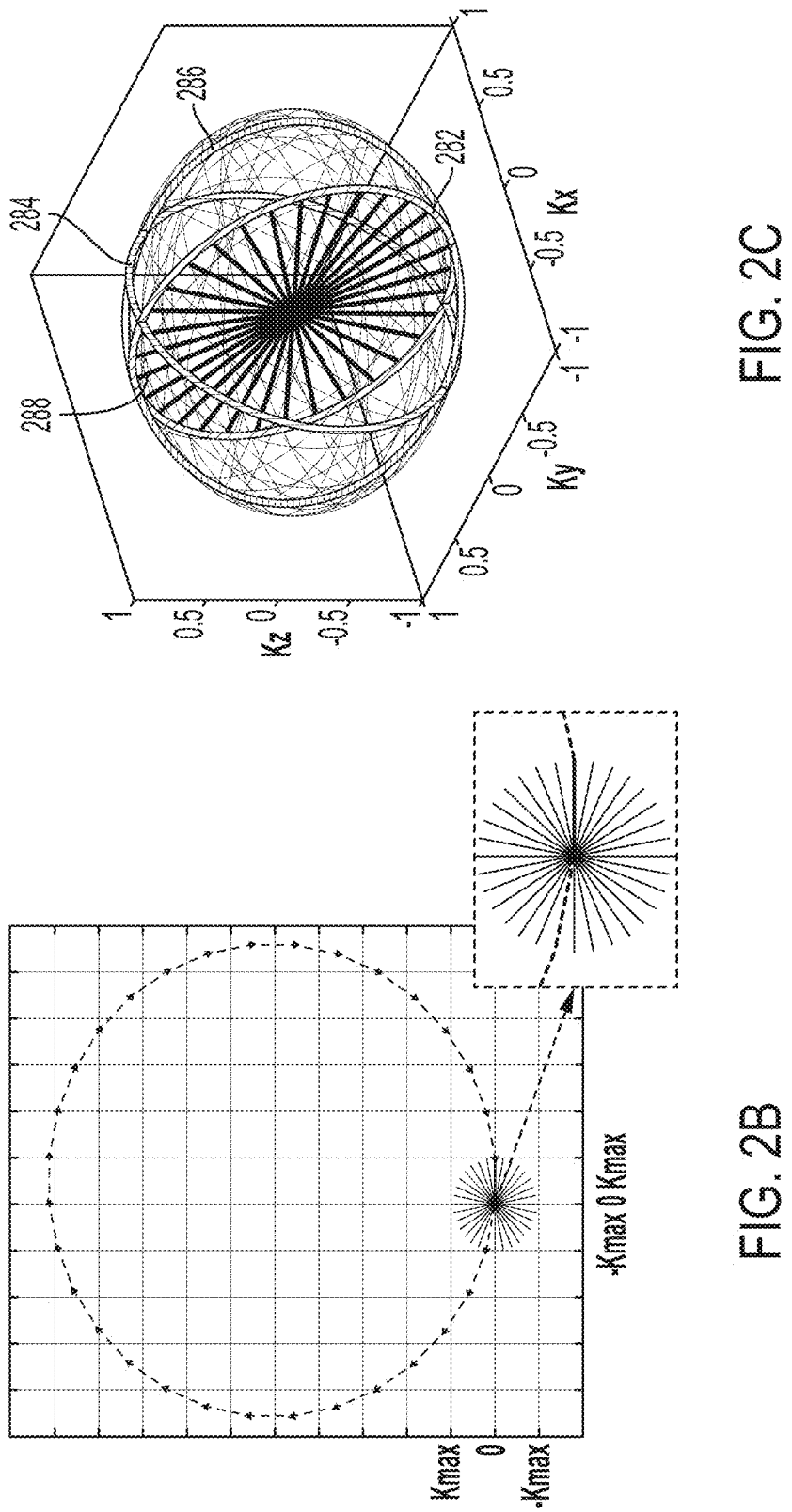
FIG. 2B illustrates example corresponding k-space encoding for the 32 spokes of the example of FIG. 2A.
FIG. 2C illustrates an example three-dimensional (3D) spatial encoding via random rotation of the 32 planes (loops) to achieve full 3D k-space coverage (total of 1024 spokes per fMRI volume).

Furthermore, some implementations of MRI distinguish between a free-induction-decay (FID) signal and a gradient echo (GRE) signal. FIGS. 2A, 2B, and 2C illustrate examples of this. More specifically, FIG. 2A illustrates a FID signal collection phase 210 (e.g., approximately between TE=0 msec and TE=26.8 msec), and a GRE signal collection phase 220 (e.g., approximately starting at TE=26.8 msec). In the example of FIG. 2A, during the FID signal collection phase 210, a sequence of RF pulses 234 (e.g., starting with the individual RF pulses RF1, RF2, RF3) is applied to the subject (e.g., via the RF transmit coil 124) while a gradient magnetic field 232 is also applied (e.g., via the gradient coil 122). In the example implementation of FIG. 2A, the RF pulses RF1, RF2, and RF3 are each, respectively, followed very closely by the collections at FID1, FID2, and FID3.

During the GRE signal collection phase 220, the same gradient magnetic field 232 is applied but no RF pulse sequence is applied (e.g., the RF transmit coil 124 is shut off), thus creating the measured GRE signal (e.g., starting with GRE pulses GRE1, and GRE2). Although not illustrated in the example of FIG. 2A, individual GRE pulses may overlap in time (e.g., as illustrated in the example of FIG. 9), thus complicating the image reconstruction. As will be described in further detail elsewhere herein, some embodiments advantageously reduce artifacts resulting from this overlap.

Figure 2D:
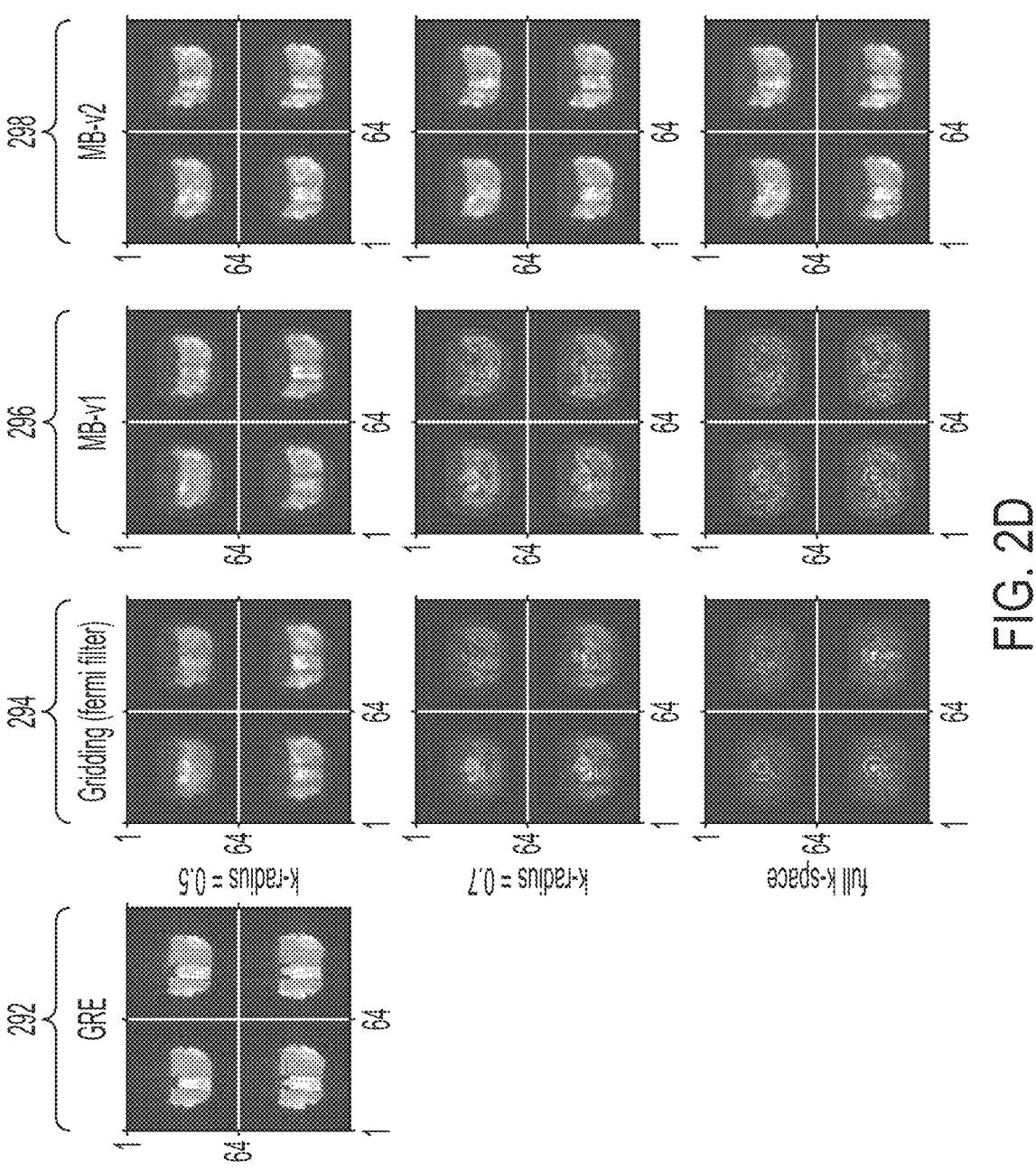
FIG. 2D shows an example reconstruction for a structured phantom.
Figure 2E:
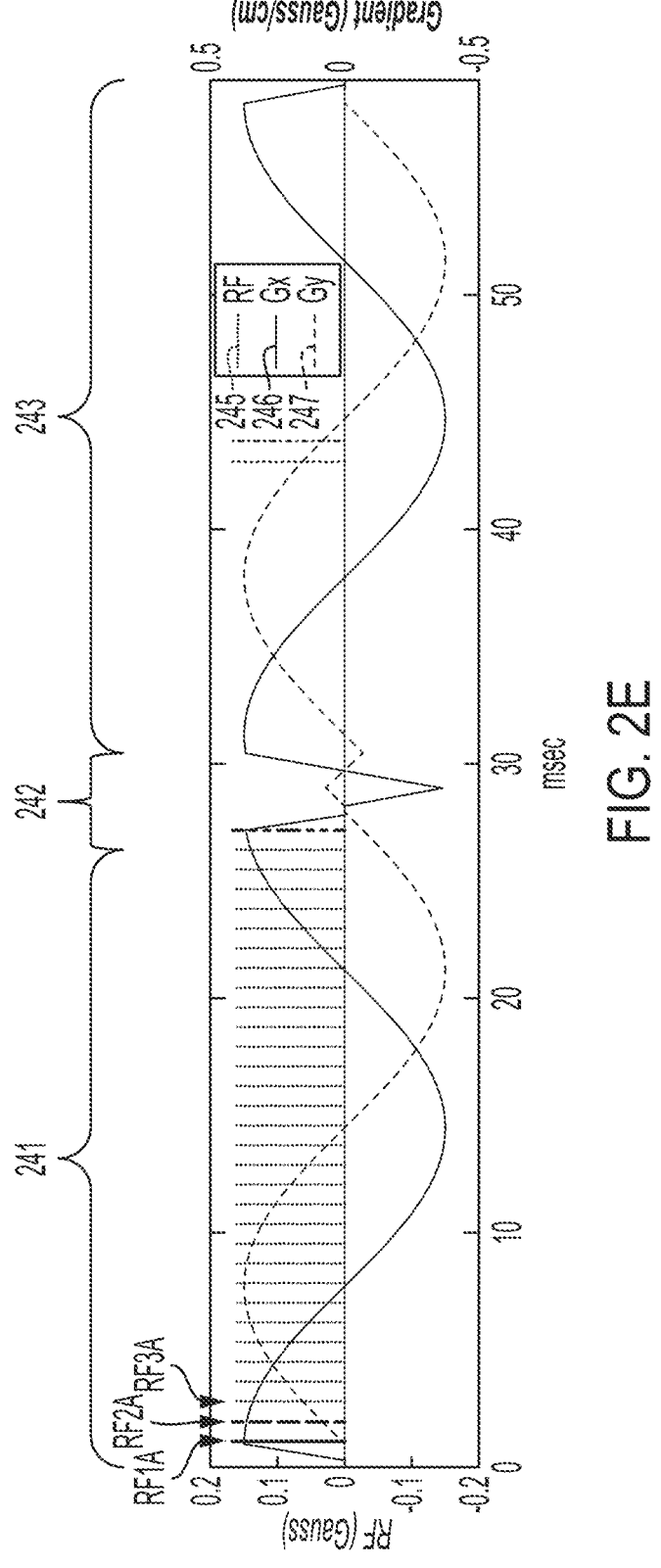
FIG. 2E illustrates an additional example pulse sequence diagram for looping-star fMRI.

FIG. 2E illustrates an additional example pulse sequence diagram for looping-star fMRI, including a ramp up and ramp down gradient between the FID and GRE pulse sequence. More specifically, FIG. 2E illustrates FID signal collection phase 241, ramp up/down phase 242, and GRE signal collection phase 243. The illustrated example further shows sequence of RF pulses 243 (e.g., starting with the individual RF pulses RF1A, RF2A, RF3A), and the GRE signal (e.g., including $G_x$ component 246, and $G_y$ component 247).

The computing device 130 may include one or more processors 135 such as one or more microprocessors, controllers, and/or any other suitable type of processor. The computing device 130 may further include a memory 140 (e.g., volatile memory, non-volatile memory) accessible by the one or more processors 135 (e.g., via a memory controller). Additionally, the computing device 130 may include a user interface 160, which may be controlled by the one or more processors 135 to display, for example, MRI images of the patient 110. The user interface 160 may further be used to control (e.g., via the MRI controller 150) the MRI machine 120 (e.g., control the gradient coil 122, the RF transmit coil 124, the RF receive coil 126, etc. by administering a pulse sequence and/or receiving signals).

The one or more processors 135 may interact with the memory 140 to obtain, for example, computer-readable instructions stored in the memory 140. Additionally or alternatively, computer-readable instructions may be stored on one or more removable media (e.g., a compact disc, a digital versatile disc, removable flash memory, etc.) that may be coupled to the computing device 130 to provide access to the computer-readable instructions stored thereon. In particular, the computer-readable instructions stored on the memory 140 may include instructions for executing various applications, such as a flip angle calculator 142, RF pulse shape calculator 144, RF pulse sequence determiner 146, gradient waveform determiner 148, MRI controller 150, MRI data acquirer 152, and/or reconstructor 154.

Furthermore, the computing device 130 may be connected to the MRI machine 120 and/or MRI database 170 via network 104, which may be a wired or wireless network, such as the internet. The MRI database 170 may store any MRI data, such as fully or partially sampled reference MRI data.

1 Introduction

The example MRI system 100 may be used as any type of MRI system, and, in one example, may be used a functional magnetic resonance imaging (fMRI) system. As is known in the art, fMRI has evolved into the dominant tool for non-invasively imaging human brain activity. However, the loud acoustic noise in fMRI still remains a problem. For example, acoustic noise could cause discomfort and anxiety in patients, especially for certain groups of individuals, such as children or patients with dementia. Furthermore, acoustic noise is an additional confounding sensory stimulus, and can impact the blood oxygen level dependent (BOLD) response as a function of both its loudness [Dardo Tomasi, Elisabeth C Caparelli, Linda Chang, and Thomas Ernst. fMRI-acoustic noise alters brain activation during working memory tasks. Neuroimage, 27(2):377-386, 2005] and duration [Thomas M Talavage, Whitney B Edmister, Patrick J Ledden, and Robert M Weisskoff. Quantitative assessment of auditory cortex responses induced by imager acoustic noise. Human brain mapping, 7(2):79-88, 1999].

The acoustic noise comes from Lorentz forces caused by rapidly changing currents in the magnetic field gradient coils 122 used primarily for spatial localization. The acoustic noise level can be reduced by hardware modifications, such as gradient designs and shielding [William A Edelstein, Tesfaye K Kidane, Victor Taracila, Tanvir N Baig, Timothy P Eagan, Yu-Chung N Cheng, Robert W Brown, and John A Mallick. Active-passive gradient shielding for MRI acoustic noise reduction. Magnetic Resonance in Medicine: An Official Journal of the International Society for Magnetic Resonance in Medicine, 53(5):1013-1017, 2005], quiet scanning mode provided by the vendors [F Hennel, F Girard, and T Loenneker. "silent" MRI with soft gradient pulses. Magnetic Resonance in Medicine: An Official Journal of the International Society for Magnetic Resonance in Medicine, 42(1): 6-10, 1999], and pulse sequence design [Markus Weiger, Klaas P Pruessmann, and Franciszek Hennel. MRI with zero echo time: hard versus sweep pulse excitation. Magnetic resonance in medicine, 66(2):379-389, 2011].

Looping-star pulse [Florian Wiesinger, Anne Menini, and Ana Beatriz Solana. Looping star. Magnetic resonance in medicine, 81(1):57-68, 2019] is a silent MRI pulse sequence that can be used for quantitative susceptibility mapping (QSM), $$T_2^*$$

weighted imaging, and fMRI. (As is known in the art, $$T_2^*$$

weighted imaging, also known as T2-star weighted imaging, refers to imaging built from the principle that the transverse component of the magnetization vector exponentially decays towards its equilibrium value of zero, which is due to spin-spin relaxation and magnetic field inhomogeneity.) It is especially well suited when low acoustic noise is required. However, because of the specific design of the acquisition, this pulse sequence suffers from an overlapping-echo effect (which will be explained in further detail below, e.g., with respect to FIG. 9), which comes from signals from multiple excitation pulses being simultaneously present while looping through k-space locations. The conventional gridding reconstruction resolves these overlapping signals at the cost of either reduced image resolution due to the filtered k-space data, or doubled scan time due to the RF phase cycling. Some embodiments described herein propose a model-based reconstruction [Jeffrey A Fessler. Model-based image reconstruction for MRI. IEEE signal processing magazine, 27(4): 81-89, 2010] that can resolve the overlapping echoes and maintain the resolution without increasing the scan time. Some advantages of the disclosed techniques are increasing the signal-to-noise ratio (SNR) and avoiding artifacts caused by overlapping-echo signals.

Four different example advantageous aspects to the disclosed techniques include the following: (1) reducing the artifacts due to overlapping-echoes and the non-uniform excitation profile via model-based reconstruction; (2) joint reconstruction of FID and GRE signals to model $$T_2^*$$

effects and field inhomogeneity, thus resulting in better $$T_2^*$$

-weighted images and QSM; (3) a variable flip angle (VFA) scheme that maximizes the signal amplitude and uniformity over time; and (4) a shaped RF pulse method designed to improve the excitation profile uniformity, which may be necessary when applying larger flip angles to increase SNR.

2 Materials and Methods

2.1 Original Looping-Star

The looping-star sequence used for fMRI [Beatriz Dionisio-Parra, Florian Wiesinger, Philipp G Sämann, Michael Czisch, and Ana Beatriz Solana. Looping star fMRI in cognitive tasks and resting state. Journal of Magnetic Resonance Imaging, 52(3):739-751, 2020] can acquire $$T_2^*$$

-weighted gradient-echo imaging data while maintaining its quiet performance. FIG. 2A illustrates an example pulse sequence diagram for looping-star fMRI; and FIG. 2B illustrates example corresponding k-space encoding for the 32 spokes of the example of FIG. 2A.

With continuing reference to the example of FIG. 2A, during the first half of a segment (e.g., during phase 210), the radial spokes are excited using short, hard RF pulses 234 with a slightly changing gradient 232 to control the direction of the trajectory. In the second half of the segment (e.g., during phase 220), the same gradient 232 is applied again but without RF pulses 234 to create the gradient echo (GRE) signal. Thus, this sequence acquires free-induction-decay (FID) image at TE≈0, and also the gradient echo image at TE=26.8 msec, which is expected to give sufficient functional BOLD contrast at 3 T. The k-space trajectory may be encoded such that it forms a closed circle on a sphere and it was repeated twice per segment for FID and GRE echo. The 3D trajectory is generated by randomly rotating the 2D closed circle 32 times.

FIG. 2B illustrates example corresponding k-space encoding for the 32 spokes of the example of FIG. 2A, which shows the self-refocusing trajectory of the first excitation.

FIG. 2C illustrates an example 3D spatial encoding via random rotation of the 32 planes (loops) to achieve full 3D k-space coverage (total of 1024 spokes 288 per fMRI volume). Further in the example of FIG. 2C, loop 282 is the first loop, loop 284 is the second loop, and loop 286 is the third loop.

2.2 Model-Based Reconstruction for Looping-Star

In looping-star fMRI, with an assumption of $n_{spk}$ RF pulses in one cycle of FID and following GRE, there will be up to $n_{spk}$ k-space trajectories, each corresponding to the RF pulses that have been applied there before.

Therefore, the signal sampled at any time t, denoted by s(t), is a superposition of $n_{spk}$ k-space samples located on corresponding trajectories. Theoretically, the optimal signal model would take all those k-space locations into account, which would usually need approximately $512^3$ spatial resolution to cover high frequency locations.

The corresponding signal equation of jth receiver coil with sensitivity map is given by [Jeffrey A Fessler. Model-based image reconstruction for MRI. IEEE signal processing magazine, 27(4):81-89, 2010]:

$$s_j(t) = \int c_j(\vec{r}) f(\vec{r}) \left( \sum_{l=1}^{L} e^{-z(\vec{r})t_l} e^{-i2\pi \vec{k}_l(t_l)\vec{r}} \right) d\vec{r} \qquad \text{eq. (1)}$$

where $c_j(\vec{r})$ is the sensitivity map of jth receiver coil, $f(\vec{r})$ is the continuous proton density weighted object, $$z(\vec{r}) \triangleq \frac{1}{T_2^*} + l\Delta w_0(\vec{r})$$

is the "rate map", $t_l$ is the time after excitation for lth RF pulse, and L is the number of RF pulses that has been applied before, which is less than $n_{spk}$ in FID and may always be equal to $n_{spk}$ in GRE.

However, this signal model could be simplified to only include signal from the low frequency samples and its nearest samples in k-space. In some embodiments, the high frequency signal is ignored due to its significantly smaller amplitude (by an order of magnitude of 3 or more) than the low frequency signal.

$$s_j(t) = \int c_j(\vec{r}) f(\vec{r}) \left( \sum_{l=1}^{2} e^{-z(\vec{r})t_l} e^{-i2\pi \vec{k}_l(t_l)\vec{r}} \right) d\vec{r} \qquad \text{eq. (2)}$$

In model-based reconstruction [Jeffrey A Fessler. Model-based image reconstruction for MRI. IEEE signal processing magazine, 27(4):81-89, 2010], the object $f(\vec{r})$ may be approximated by using a finite series expansion as the following voxel-indicator-function $$f(\vec{r}) = \sum_{n=1}^{N} f_n b(\vec{r} - \vec{r}_n) \qquad \text{eq. (3)}$$

where b($\bullet$) denotes the object basis function, $\vec{r}_n$ denotes the center of jth translated basis function, and N is the number of parameters.

After discretization [Bradley P Sutton, Douglas C Noll, and Jeffrey A Fessler. Fast, iterative image reconstruction for MRI in the presence of field inhomogeneities. IEEE transactions on medical imaging, 22(2):178-188, 2003], eq. (2) can be further approximated by the following discrete-space model $$s_j(t) = \sum_{l=1}^{2} B(k(t_l)) \sum_{n=0}^{N-1} c_j(\vec{r}) e^{-z(\vec{r}_n)t_l} e^{-l2\pi\vec{k}_l(t)\cdot\vec{r}_n} \qquad \text{eq. (4)}$$

The noisy measured signals in matrix-vector form may be expressed as follows $$s = Af + \epsilon \qquad \text{eq. (5)}$$

where $f=(f_1, \ldots, f_N)$ is the vector of parameters (pixel values). One goal is to estimate $f$ from the measurement s. The system matrix A can be represented by the sum of 2 sub-system matrices corresponding to each spoke:

$$A = A_1 + A_2 \qquad \text{eq. (6)}$$

where each element of the lth sub-system matrix $A_l$ is $$a_{ljmn} = B(k(t_{l,m})) c_j(\vec{r}_n) e^{-z(\vec{r}_n)t_{l,m}} e^{-l2\pi\vec{k}_l(t_m)\cdot\vec{r}_n} \qquad \text{eq. (7)}$$

where m is an index for discrete time point in k-space, n is an index for a discrete image grid, j is an index for coils, and l is an index for overlapped spokes. In this regard, it may be noted that A, $A_1$, and $A_2$ may be constructed based on k-space sampling locations, which are known in advance of the scan (not based on the recorded signal). With this discrete system matrix, the conjugate gradient method may be used to reconstruction an image by optimizing the following cost function $$\hat{x} = \underset{x}{\operatorname{argmin}} \|s - Ax\|_2^2 + \beta R(x) \qquad \text{eq. (8)}$$

where s is the sampled signals, A is combined system matrix, and R($\bullet$) is a roughness regularizer, such as a quadratic roughness regularizer.

Although the system model A is represented mathematically as a matrix, its practical implementation can take forms other than a dense 2D array. For example, the discrete Fourier transform (DFT) corresponds to a matrix, but it may be implemented efficiently using fast Fourier transform (FFT) operations.

One major advantage of using such a model-based method is that the echo-in and echo-out spokes overlapping can be modeled at the cost of constructing a few system matrices, but without any additional pulse sequence changes. In previous work, this signal overlapping problem was addressed by either applying a Hanning window, which decreases the spatial resolution of the reconstructed images, or using a phase-cycling RF method, which doubles the scan time, though it does increase the SNR by a factor of $\sqrt{2}$ [Nikou Damestani and et al. Coherence-resolved looping star—improvements for silent multi-gradient echo structural and functional neuroimaging. ISMRM, 2021].

2.3 Joint Reconstruction of FID and GRE Signals

In previous model-based reconstruction section, FID and GRE signals were separately (not jointly) reconstructed using eq. (2). In addition, it may be noted that a joint reconstruction of zero echo time signal and multiple spin-echo signals has been proposed [Tilman J Sumpf, Martin Uecker, Susann Boretius, and Jens Frahm. Model-based nonlinear inverse reconstruction for T2 mapping using highly undersampled spin-echo MRI. Journal of Magnetic Resonance Imaging, 34(2):420— 428, 2011] to jointly estimate proton density maps and $$T_2^*$$

maps.

In contrast to the previous techniques, the techniques described herein propose the following optimization problem for joint reconstruction of proton density (PD) maps and relaxation maps:

$$(\hat{\rho}, \hat{z}) = \underset{\rho,z}{\operatorname{argmin}} \left\| \begin{pmatrix} S_f \\ S_g \end{pmatrix} - \begin{pmatrix} A_f & 0 \\ 0 & A_g \end{pmatrix} \begin{pmatrix} \rho \\ \rho \cdot z \end{pmatrix} \right\|_2^2 + \beta_1 R_1(\rho) + \beta_2 R_2(z) \qquad \text{eq. (9)}$$

where $s_f$ and $s_g$ are signals from FID and GRE respectively. $A_f$ and $A_g$ are system matrices for FID and GRE that can be computed by eq. (6). $\rho$ is the density map.

$$z = e^{-T_E/T_2^*}$$

is decay term (relaxation map) due to $$T_2^*$$

$R_1(\bullet)$ is regularizer for proton density map, usually a quadratic function in practice; and $R_2(\bullet)$ is regularizer for $$T_2^*$$

map.

This optimization problem eq. (9) is biconvex and can be solved by alternatively updating $\rho$ and z by fixing one of them and solving the corresponding convex optimization problem [Jochen Gorski, Frank Pfeuffer, and Kathrin Klamroth. Biconvex sets and optimization with biconvex functions: a survey and extensions. Mathematical methods of operations research, 66(3):373-407, 2007]. The sub-problem for the PD map can be formulated as $$\hat{\rho} = \underset{\rho}{\operatorname{argmin}} \left\| \begin{pmatrix} S_f \\ S_g \end{pmatrix} - \begin{pmatrix} A_f & 0 \\ 0 & A_g \end{pmatrix} \begin{pmatrix} I \\ Z \end{pmatrix} \rho \right\|_2^2 + \beta_1 R_1(\rho) \qquad \text{eq. (10)}$$

and that for the relaxation map is $$\hat{z} = \underset{z}{\operatorname{argmin}} \|s_g - A_g Pz\|_2^2 + \beta_2 R_2(z) \qquad \text{eq. (11)}$$

where Z=diag(z) and P=diag($\rho$). One advantage of joint design is that the proton density weighted image and $$T_2^*$$

map may be estimated from a signal that is twice as long, thus reducing the relative noise level. Another advantage is allowing for a choice of at least two different regularizers, which can be determined by prior knowledge, for proton density weighted image and $$T_2^*$$

map respectively.

2.4 Variable Flip Angle Scheme

The original looping-star used a constant flip angle scheme below the Ernst angle, i.e., 1°, to avoid a transient T1 effect and keep the length of RF pulse short. However, the flip angle can be increased to maximize SNR if the dynamic equilibrium of the longitudinal magnetization could be modeled to create a uniform transverse magnetization. Some embodiments adapt the Ernst angle derivation to a looping-star sequence and compute an optimal constant flip angle. Furthermore, some embodiments use a variable flip angle scheme that further improves the signal amplitude and uniformity over time.

Assume the longitudinal magnetization is in steady-state between blocks, and the flip angle of the ith RF pulse is $\alpha_i$, then according to the T1 decay $$M_z^{i+1} = M_0(1 - E_1) + E_1 \cos \alpha_i M_z^i \qquad \text{eq. (12)}$$

And in steady state:

$$M_z^1 = M_0(1 - E_2) + E_2 \cos \alpha_n M_z^n \qquad \text{eq. (13)}$$

where $$E_1 = e^{-\left(\frac{t_{spk}}{T1}\right)}$$

is the T1 decay between the RF pulses, and $$E_2 = e^{-\left(\frac{TR - (n-1)t_{spk}}{T1}\right)}$$

is the T1 decay effect between the end of the last RF pulse of the current segment and the first RF pulse from the next segment.

Combining eq. (12) and eq. (13) yields $$M_z^1 = M_0 \frac{(1 - E_2) + E_2(1 - E_1)\sum_{k=1}^{n-1}\prod_{j=0}^{k-1} E_1 \cos \alpha_{n-j}}{1 - E_{TR}\prod_{k=1}^{n} \cos \alpha_k} \qquad \text{eq. (14)}$$

where $$E_{TR} = e^{-\left(\frac{TR}{T1}\right)}$$

is the T1 decay between segments.

The corresponding transverse plane may then be computed by a small-tip-angle approximation.

2.4.1 Constant Flip Angles

In the simplest case that the flip angle is constant over spokes, some embodiments optimize the flip angle by maximizing the transverse plane signal according to $$\hat{\alpha} = \underset{\alpha}{\operatorname{argmax}} M_z^1 \sin \alpha = \qquad \text{eq. (15)}$$

$$\underset{\alpha}{\operatorname{argmax}} M_0 \frac{(1 - E_2) + E_2(1 - E_1)\dfrac{1 - (E_1 \cos \alpha)^{n-1}}{1 - E_1 \cos \alpha}}{1 - E_{TR}(\cos \alpha)^n} \sin \alpha$$

This optimization problem can be solved by setting the gradient of eq. (15) to zero. It is equivalent to finding zeros of a polynomial of order n, which can be solved using the appropriate computer algorithm.

2.4.2 Variable Flip Angles

When the flip angles are allowed to vary from spoke to spoke, a series of flip angles $\alpha = \{\alpha_1, \ldots, \alpha_n\}$ can be optimized by maximizing either the sum or the minimal transverse plane signals $$\hat{\alpha} = \underset{\alpha}{\operatorname{argmax}} \sum_{k=1}^{n} M_z^k \sin \alpha_k = \underset{\alpha}{\operatorname{argmax}} M_0 \sum_{k=1}^{n} f^k(M_z^1) \sin \alpha_k \qquad \text{eq. (16)}$$

where $f(x) = M_0(1-E) + E \cos \alpha_i \cdot x$ is a linear operator from eq. (12).

It is hard to explicitly express the minimizer of the cost function. This is a differentiable function of the flip angles so it can be optimized numerically using gradient-based algorithms.

2.4.3 Linear Flip Angles

The optimized flip angle found by solving eq. (16) numerically appears to be nearly linearly increasing, which motivates the following simplified linear version. Assume the cosine values of the flip angles are linearly increasing $$\cos \alpha_{i+1} = \gamma \cos \alpha_i \qquad \text{eq. (17)}$$

where $\gamma$ is the parameter controlling the linearity of the flip angles.

Substituting eq. (17) into eq. (14) gives $$M_z^1 = \frac{(1 - E_2) + \dfrac{E_2}{E_1}(1 - E_1)\sum_{k=1}^{n-1}(E_1 \cos\alpha_1)^k \gamma^{kn-k(k+1)/2}}{1 - E_{TR}(\cos\alpha_1)^n \gamma^{n(n-1)/2}} \qquad \text{eq. (18)}$$

The corresponding optimization problem in terms of flip angle and linear coefficient $\gamma$ is $$(\hat\alpha_1, \hat\gamma) = \qquad\qquad\qquad\qquad\qquad \text{eq. (19)}$$

$$\operatorname*{argmax}_{\alpha_1,\gamma}\sum_{k=1}^{n} M_z^k \sin\alpha_k = \operatorname*{argmax}_{\alpha_1\gamma} M_0 \sum_{k=1}^{n} f^k\!\left(M_z^1\right)\sin\alpha_k$$

Solving this linear flip angle (LFA) optimization problem is simpler because it: (i) does not involve repeated multiplication, (ii) generates an excitation profile similar to the previous VFA scheme, and (iii) maintains good signal amplitude and uniformity.

2.5 Shaped RF Pulse

Many rectangular RF pulses may be used to excite the whole field of view (FOV). For the low flip angle used in by Dionisio [Beatriz Dionisio-Parra, Florian Wiesinger, Philipp G Sämann, Michael Czisch, and Ana Beatriz Solana. Looping star fMRI in cognitive tasks and resting state. Journal of Magnetic Resonance Imaging, 52(3):739-751, 2020], RF pulses are very short and thus the bandwidth is high, so the sinc-shaped shading in spatial domain might not be obvious.

To improve the signal amplitude and uniformity, some embodiments use an optimized variable flip angle scheme that is possibly three times longer than the original RF pulses. It may thus be necessary to consider the excitation profile.

The sinc-shaped excitation profile along the readout direction is [David M Grodzki, Peter M Jakob, and Bjoern Heismann. Correcting slice selectivity in hard pulse sequences. Journal of Magnetic Resonance, 214:61-67, 2012]:

$$P(\vec{r}) = \alpha \; sinc\!\left(\gamma\tau\vec{G}\cdot\vec{r}\right) \qquad \text{eq. (20)}$$

where $\alpha = \gamma B_1 \tau$ is the nominal flip angle, $B_1$ is the RF excitation amplitude, $\vec{G}$ is the spoke gradient vector, and $\vec{r}$ is the position vector.

A shaped RF pulse can be designed to increase the uniformity of the excitation profile (e.g., make a "more constant" spatial excitation) without increasing the duration significantly. A shaped RF pulse b can be given by solving the following magnitude least square (MLS) problem $$\hat{b} = \operatorname*{argmin}_{b\in\mathcal{B}} f(b), \qquad \text{eq. (21)}$$

$$f(b) \triangleq \frac{1}{2}\big\||Ab| - d\big\|_W^2$$

where $\mathcal{B}$ is set of RF pulses that satisfy the peak amplitude constraint, A is the system matrix from small tip angle approximation, and d is the desired excitation profile, usually a flat line.

This MLS problem can be solved by alternatively updating RF pulse b and a new introduced variable $\theta$. For the RF pulse update, the proximal optimized gradient method (POGM) [Donghwan Kim and Jeffrey A Fessler. Adaptive restart of the optimized gradient method for convex optimization. Journal of Optimization Theory and Applications, 178(1):240-263, 2018] may be used to optimize the constrained least square problem.

3 Results

3.1 Model-Based Reconstruction

The proposed model-based method was tested on a structured phantom, and a human brain. The proposed model-based method was further tested in a finger-tapping fMRI study with alternating 20 sec resting and finger-tapping.

FIG. 2D shows an example reconstruction for the structured phantom. More specifically, the example of FIG. 2D illustrates and compares examples of all of: the standard GRE reconstruction (scan time: 1:47 min) (column 292); looping-star reconstruction using gridding with a Fermi filter (column 294); model-based reconstruction without modeling overlapping signal (MB-v1) (column 296); and model-based method with overlapping signal modeling (MB-v2) (column 298). The MB-v2 method shows significantly reduced artifacts and improved image quality.

Figure 3:
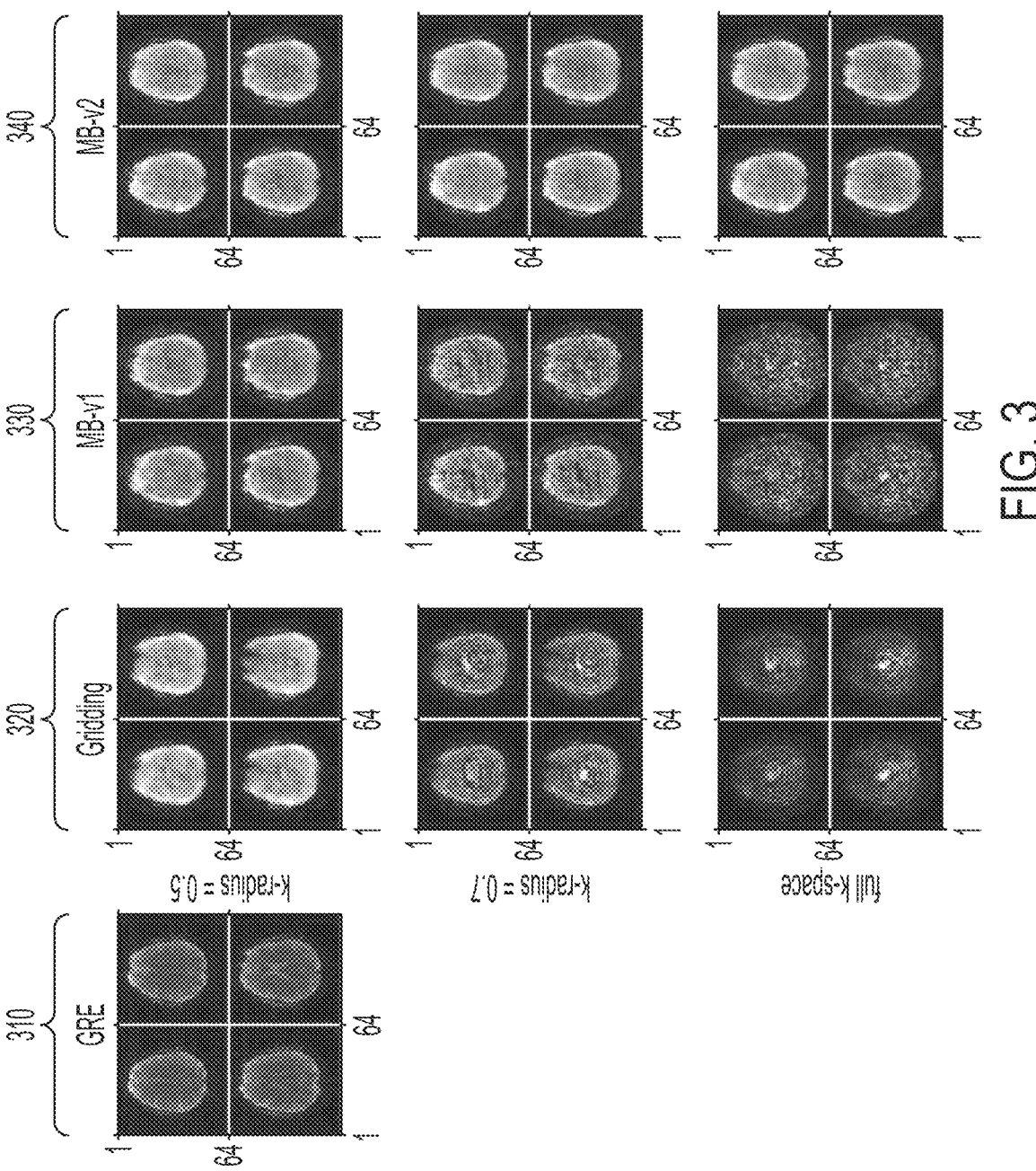
FIG. 3 shows an example reconstruction for a human scan.

FIG. 3 shows an example reconstruction for a human scan. With reference thereto, column 310 illustrates a standard GRE (scan time: 1:47 min) reconstruction. Column 320 illustrates a looping-star (scan time: 1.9 sec) reconstruction using conventional gridding. Column 330 illustrates a MB-v1 technique, and column 340 illustrates a MB-v2 technique. In some implementations, the gridding method only works when cutting almost half of the k-space data, thus reducing the image resolution and SNR. The proposed MB-v2 shows increased image quality in all cases.

Figure 4:
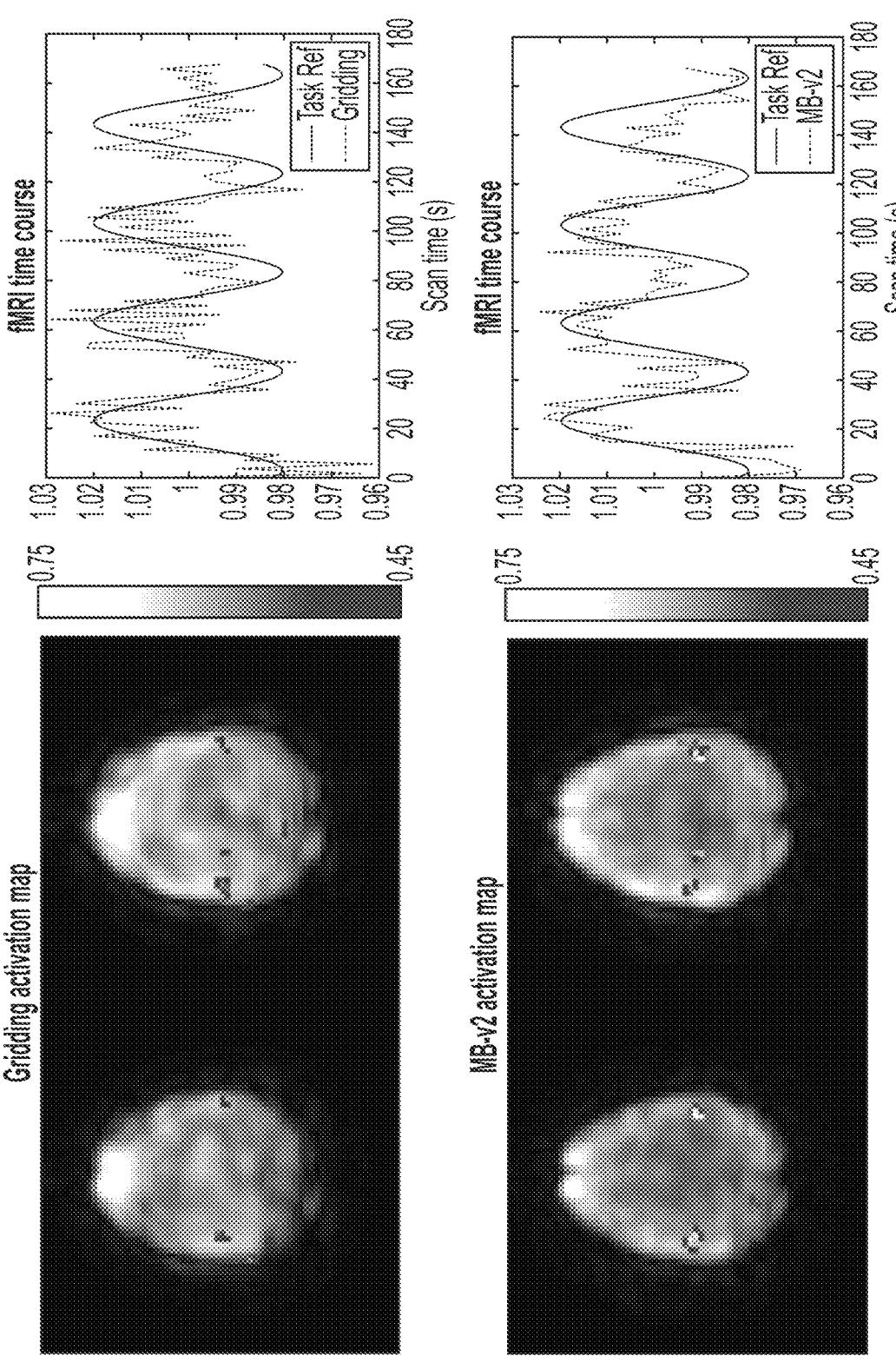
FIG. 4 shows an example activation map and fMRI time course for a finger-tapping test.

FIG. 4 shows an example looping-star fMRI test. More particularly, FIG. 4 shows an example activation map and time course for the finger-tapping test. Specifically, the top row shows the activation map and time course using conventional gridding method, and the bottom row shows the activation map and time course using proposed MB-v2 method. The proposed MB-v2 reconstruction shows higher correlation and less noise on the activation map. Its time course also matches the task reference more accurately and is less noisy.

3.2 Joint Reconstruction

Figure 5:
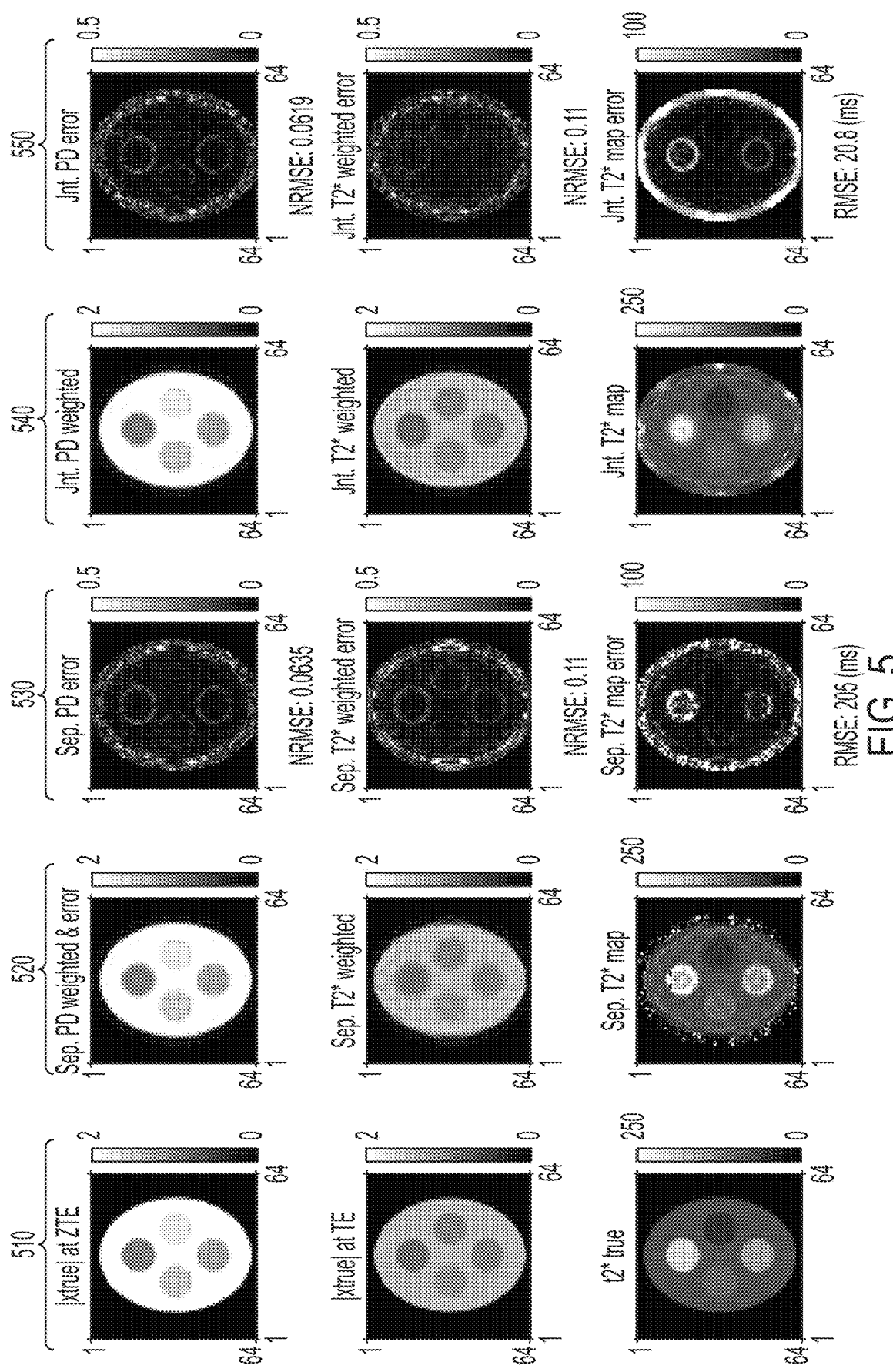
FIG. 5 shows examples of joint reconstruction of proton density (PD) and $$T_2^*$$

FIG. 5 shows examples of joint reconstruction of PD and $$T_2^*$$

maps. That is, FIG. 5 shows example simulated phantom reconstruction that combines FID and GRE reconstruction, and further improves image quality. This phantom has a piece-wise constant $$T_2^*$$

map of 50 ms, 100 ms, 150 ms, and 200 ms for each disk respectively.

More specifically, column 510 illustrates an example true image at zero echo time (ZTE), TE and $$T_2^*$$

map. Column 520 shows an example model-based separate reconstruction, and column 530 a corresponding error map. Column 540 shows an example model-based joint reconstruction, and column 550 shows an example corresponding error map.

3.3 Variable Flip Angle

Some embodiments use the physical parameters of the looping-star fMRI settings, but this section discusses using the example of only 10 RF pulses such that the VFA has been solved. FIG. 6A shows an example simulated longitudinal magnetization using a constant flip angle (CFA), VFA, and LFA; and FIG. 6B shows an example transverse magnetization using CFA, VFA, and LFA. The VFA and LFA almost yield the same flip angle series, resulting in an overlapping transverse and longitudinal magnetization in the plot. The transverse magnetization simulation shows that VFA and CFA can increase the uniformity of the signal over time at the expense of only slightly scaling of the RF pulse duration or amplitude. Though the signal variance of using a CFA is not obvious in this case where $n_{spk}=10$, it can increase to 3% when $n_{spk}=32$. In comparison to the transverse magnetization of previous works, the total signal is improved by 81%.

Furthermore, in the example of FIG. 6A, the VFA and LFA give almost the same result, and the flip angle is increasing to make the transverse magnetization more uniform. In the example of FIG. 6B, the CFA has a larger transverse magnetization at the beginning because the flip angle is larger compared to VFA and LFA, but it gradually decreases as the longitudinal magnetization decreases.

3.4 Shaped RF Pulses

FIGS. 7A-7C illustrate an example simulation of an optimized shaped RF. In these examples, a constraint is set on the peak amplitude of the RF pulse to be 0.2 gauss, and a constraint is set on the duration to be 16 µs with a resolution of 2 µs. To further elaborate, the example of FIGS. 7A-7C show a 1D excitation profile along the gradient direction of 3.32° flip angle compared between hard and shaped RF pulse of same duration. In FIG. 7A, the shaped RF pulse reaches the peak amplitude except at one point. In FIG. 7B, the RF phase is either 0 or π, showing that the optimized pulse is still along the same direction as the hard pulse. In FIG. 7C, using shaped RF pulse significantly flattened the excitation profile, and reduces the maximum absolute flip angle error from 0.48° to 0.03°.

4 Experimentation Conclusion

The proposed model-based method used both echo-in and echo-out spokes, thus reducing under-sampling effects and increasing the SNR. The image reconstruction showed reduced overlapping-echo artifacts in phantom and brain studies, and better correlation to the task reference in the fMRI test.

5 Additional Material

A.1 FID

In the continuous domain, the continuous-space object $f(\vec{r})$ can be approximated by using a finite series expansion $$f(\vec{r}) = \sum_{j=1}^{N} f_j b(\vec{r} - \vec{r}_j) \qquad \text{eq. (22)}$$

where b(•) denotes the object basis function, usually a rect function, $\vec{r}_j$ denotes the center of the jth translated basis function, and N is the number of parameters.

First considering only the k-space associated with the lth RF pulse for a single receive coil, the signal model [Jeffrey A Fessler. Model-based image reconstruction for MRI. IEEE signal processing magazine, 27(4):81-89, 2010] is $$s_l(t) = \int c(\vec{r}) f(\vec{r}) e^{-t/T_2^*(\vec{r})} e^{-l\Delta\omega_0 t} e^{-l2\pi \vec{k}_l(t) \cdot \vec{r}} \cdot d\vec{r} \qquad \text{eq. (23)}$$

With the relationship $t_{l+1}=t_l+t_{seg}$ and letting $t=t_l$ denote the time for the current spoke, the overlapping signal from all L k-space trajectories is $$s(t) = \sum_{l=1}^{L} s_l(t_l) = \sum_{l=1}^{L} \int c(\vec{r}) f(\vec{r}) e^{-t_l/T_2^*(\vec{r})} e^{-l\Delta\omega_0 t_l} e^{-l2\pi(\vec{k})_l(t_l) \cdot \vec{r}} \cdot d\vec{r} \qquad \text{eq. (24)}$$

Defining the "rate map" $z(\vec{r})$ to be $$z(\vec{r}) \triangleq 1/T_2^*(\vec{r}) + l\Delta\omega_0(\vec{r}) \qquad \text{eq. (25)}$$

and bringing the sum inside the integral, the received signal (e.g., signal-FID2) can be seen to be the superposition of L terms:

$$s(t) = \int c(\vec{r}) f(\vec{r}) \left( \sum_{l=1}^{L} e^{-z(\vec{r})t_l} e^{-l2\pi \vec{k}_l(t_{l,i}) \vec{r}} d\vec{r} \right) \qquad \text{eq. (26)}$$

where L is the number of RF pulses that have been applied.

A.1.1 Gradient Echo (GRE) Signal Model

The signal model for a gradient echo (GE) is similar to the one for FID, except that GE always has $n_{seg}$ sample locations, leading to the following signal model $$s(t) = \int c(\vec{r}) f(\vec{r}) \left( \sum_{l=1}^{n_{seg}} e^{-z(\vec{r})t_l} e^{-l2\pi \vec{k}_l(t_{l,i}) \vec{r}} d\vec{r} \right) \qquad \text{eq. (27)}$$

FIG. 8 illustrates example k-space locations and $$T_2^*$$

decay in a signal using the parameters in [Florian Wiesinger, Anne Menini, and Ana Beatriz Solana. Looping star. Magnetic resonance in medicine, 81(1):57-68,2019]. Because of either slow $$T_2^*$$

decay due to the short readout duration or the repeated k-space samples at low frequency due to the cyclical nature of the k-space trajectories, some embodiments include at least one previous spoke and one or two subsequent spokes in the model-based reconstruction, especially for GRE imaging. The forward model using NUFFT may require $mN_s \log(N_s)$ operations, where m is the number of spokes that are included in the signal model.

The example of FIG. 8 further illustrates a train of k-space samples (1/FOV) at certain times. That is, FIG. 8 illustrates a k-space sample location of a current spoke, and k-space sample locations of previous spokes. Signal intensity may come from a 2D Shepp-Logan phantom.

$$T_2^*$$

decay is modeled with $$T_2^*$$

=40 ms and $\Delta t_{n_{seg}}$=840 µs.

A.2 Linear Reconstruction

Under the signal model, the image reconstruction problem is to estimate the object $f(\vec{r})$ from the measurement vector $y=(y_1, \ldots, y_{n_d})$.

A.2.1 Discretization

Substituting the basis expansion eq. (22) into the signal model and simplifying leads to the discrete forward model $$s(t_i) = \sum_{l=1}^{L} s_l(t_i) = \sum_{l=1}^{L} \sum_{j=1}^{N_S} a_{lij} f_j \qquad \text{eq. (28)}$$

where the elements $\{\alpha_{lij}\}$ of the system matrix $A_l$ associated with the lth spokes are given by $$a_{lij} = \int b(\vec{r} - \vec{r_j}) c(\vec{r}) e^{-z(\vec{r})t_{l,i}} e^{-i2\pi \vec{k}_l(t_{l,i})\vec{r}} d\vec{r} \qquad \text{eq. (29)}$$

where $t_{l,i}$ is the passed time for lth spoke since excited.

One of the choices of basis function is a "rect" function. By substituting the rect function in eq. (7) [Bradley P Sutton, Douglas C Noll, and Jeffrey A Fessler. Fast, iterative image reconstruction for MRI in the presence of field inhomogeneities. IEEE transactions on medical imaging, 22(2):178-188, 2003], $$a_{lij} \approx \text{sinc}\left(\frac{\vec{k}_l(t_{l,i})}{\Delta}\right) c(\vec{r_j}) e^{-z(\vec{r_j})t_{l,i}} e^{-i2\pi \vec{k}_l(t_{l,i})\vec{r}_j} \qquad \text{eq. (30)}$$

and $$A = \sum_{l=1}^{L} A_l$$

where each element in A is defined by $$a_{ij} = \sum_{l=1}^{L} a_{lij} \qquad \text{eq. (31)}$$

B Joint Reconstruction in Hi-Resolution Protocol

In the hi-resolution protocol, more than 1 GRE echo may be acquired, and these echoes may be jointly reconstructed to improve the accuracy and robustness of the reconstruction. Mathematically, in addition to the signals illustrated in eq. (10), an additional GRE echo signal $s_g$ may be acquired; subsequently, the spin density and rate map can be acquired by optimizing the following equation $$\hat{\rho}, \hat{z} =$$

$$\underset{\rho,z}{\text{argmin}} \left\| \begin{pmatrix} s_f \\ s_g \\ s_{g2} \end{pmatrix} - \begin{pmatrix} A_f & 0 & 0 \\ 0 & A_g & 0 \\ 0 & 0 & A_g \end{pmatrix} \begin{pmatrix} I \\ Z \\ ZZ \end{pmatrix} \rho \right\|_2^2 + \beta_1 R_1(\rho) + \beta_2 R_2(z) \qquad \text{eq. (32)}$$

If there are additional collected echoes, they can also be appended to the eq. (32) as additional rows.

C Supplemental Material—Overlapping Echoes

The following section further illustrates aspects of overlapping echoes.

C.1 Explanation of Overlapping Echoes

Overlapping echoes always exist when more than one RF pulse is applied, especially when closely spaced in time. This is because each RF pulse excites spins, and thus creates an echo. The sampled signal will be the sum of multiple echoes, which is referred to herein as overlapping echoes.

Mathematically, the summed signal can be expressed by eq. (6) and eq. (7). One example is shown in FIG. 9, which is simplified to the case of only 2 RF pulses and 2 corresponding echoes. In an actual looping-star pulse sequence, there may be multiple RF pulses, e.g., 32 in fMRI protocol, so there may be many more overlapping echoes. It should also be noted that two of the many echoes are referred to as the 'echo-in' and 'echo-out' echoes since these two echoes are located at the low-frequency k-space, and therefore contribute more to the summed signal.

In the example of FIG. 10A, echoes 1010 overlap with echoes 1020; curves 1030 are overlapped echoes from other spokes which are located on much higher frequency and therefore not being considered in reconstruction. The example of FIG. 10B shows a zoomed-in portion of FIG. 10A. Line 1040 shows the cutoff frequency and the signals after the black line are discarded in conventional method. FIG. 10C illustrates zoomed-in portions of FIG. 10B showing how high-frequency echoes are overlapped.

C.2 Resolving Overlapping Echoes

Since only the summed signal can be sampled, it may be important to resolve the signal to get the best possible reconstruction. A simple way to suppress the artifact from overlapping signals is to weight the overlapped part less [Beatriz Dionisio-Parra, Florian Wiesinger, Philipp G Sämann, Michael Czisch, and Ana Beatriz Solana. Looping star fMRI in cognitive tasks and resting state. Journal of Magnetic Resonance Imaging, 52(3):739-751, 2020], but that method discards half of the low-frequency k-space data and suppresses high-frequency k-space data, degrading both SNR and image resolution. Another way to mitigate the artifact is to increase the interval between RF pulses, such that the signals are overlapped less in time domain [Nikou Damestani and et al. Coherence-resolved looping star— improvements for silent multi-gradient echo structural and functional neuroimaging. ISMRM, 2021]. That method may reduce the artifacts, but at the cost of degrading the temporal resolution by a factor of two, making it less useful in an fMRI study. The proposed model-based method models the k-space trajectories for each spoke and then uses multiple system matrices to model the overlapping effect. Details can be found in section 2.2.

C.3 Potential Challenges of Resolving Overlapping Echoes

There are a few challenges to resolve the overlapping echoes correctly and accurately. The first challenge is that it is hard to model all overlapping echoes due to memory and computation limitations. Practical reconstructed images in fMRI usually have less than 256 cubic resolution. This finite image size will limit both the k-space extent and also lead to Fourier transform inaccuracy in high-frequency signal computation. Therefore, the modeling of echoes other than center-in (e.g., echo-in) and center-out (e.g., echo-out) echoes will be inaccurate. So some embodiments disclosed herein may model only the echo-in and echo-out spokes and do not model the remaining of the spokes (that have much small amplitudes).

The second challenge is to recover the much smaller high-frequency signals that overlap with the larger low-frequency signals. Since the echoes are backward overlapped, e.g., low-frequency signal components are mixed with high-frequency signal components, it may be difficult to recover the high-frequency signal even if there is only a small deviation of the low-frequency signal model. There may be a limit of how much high-frequency signal can be recovered, depending on the ratio of high-frequency signals to the noise. Besides noise, the under-estimation of DC value, which is also due to the finite image size, could cause low-frequency signal deviation and be another challenge for separating the high-frequency signal accurately. The third challenge is the gradient delay that shifts the acquired data in time domain. The slight time shift in k-space may cause considerable artifacts when using 3D radial k-space trajectories.

C.4 Implementation

To overcome the potential challenges mentioned above, this disclosure proposes methods to deal with the real data. In a first example, only 'echo-in' and 'echo-out' spokes and corresponding matrices are modeled in reconstruction. This ensures most of the overlapped echoes are resolved while keeping an acceptable computational speed.

In a second example, this disclosure proposed to use a smooth basis spectrum $B(k(t))$ in eq. (7) with a cutoff frequency to balance the trade-off between model accuracy and over-fitting to the model mismatch. One embodiment of $B(k(t))$ is expressed as follows $$B(k(t)) = \frac{1}{1 + e^{\frac{|k(t)| - R}{w}}} rect\left(\frac{|k(t)|}{k_{max}}\right)$$  eq. (33)

where k is the k-space location ($k_x$, $k_y$, $k_z$), R is the radius of the window, e.g., half of the image resolution, w is the transition width that can be tuned to give a smooth transition region, and $k_{max}$ is the hard cutoff frequency. Some embodiments first determine the hard cutoff frequency $k_{max}$ to prevent the high-frequency components from being distorted to fit the low-frequency deviation. The value of $k_{max}$ may be empirically chosen to be $8*(1/FOV)$ smaller than the maximum k-space extent. Then, a Fermi function $$\frac{1}{1 + e^{\frac{|k(t)| - R}{w}}}$$

may be applied to round-off the hard cutoff and reduce the ringing artifact. FIG. 11 illustrates example plots of $B(k(t))$ that may be used in an fMRI study. Because the echo-in and echo-out spokes are interleaved in alternating directions, the sub-system matrix $A_1$ and $A_2$ in eq. (6) will use the same $B(k(t))$, but in the opposite direction.

With further reference to FIG. 11, FIG. 11 illustrates examples of $B(k(t))$. Specifically, curve 1110 illustrates an example Fourier transform of the voxel indicator function, resulting in a fermi-shaped curve with a hard cutoff frequency. Curves 1120 and 1130 show how the voxel indicator function is applied to echo-out and echo-in spokes respectively.

In a third example, the gradient delay may be computed as the time difference between the nominal k-space center and the actual k-space center. Some embodiments first interpolate the phase of acquired signal near the k-space center into a sub-sampling grid (0.1 us). The actual k-space center may be the time point with least phase deviation from the mean phase. Then the nominal k-space trajectories may be shifted by the gradient delay time to aligned with the acquired data.

C.5 Additional Result

Besides the previously shown phantom and human brain results, FIG. 12 shows an example reconstruction using a high-resolution looping star protocol. It is clear that the reconstruction using the conventional gridding method suffers from artifacts due to the overlapping echoes, whereas the reconstruction using the proposed model-based method using multiple system matrices (mb2) has sharper edges and reduced artifacts since the overlapping echoes are resolved and no high-frequency data is discarded.

Example Methods

FIG. 13 illustrates a flowchart of an example method 1300 in accordance with the techniques described herein. The example method 1300 may involve two phases: an acquisition phase 1301, and a reconstruction phase 1302. In some embodiments, the blocks of the example method 1300 are performed by the one or more processors 135 of the computing device 130. However, not all of the blocks are required to be performed by the same components. For example, in some embodiments, the blocks of the acquisition phase 1301 may be performed by a first group of one or more processors, and the blocks of the reconstruction phase 1302 may be performed by a second group of one or more processors.

At block 1305 the example method 1300 begins by calculating (e.g., with the flip angle calculator 142) flip angle(s). As described above, the calculated flip angle may be a variable flip angle, or a constant flip angle. In one example implementation, for a constant flip angle, the constant flip angle may be calculated by maximizing a transverse plane signal. In another example implementation, if the flip angles are variable, a series of optimized flip angles may be calculated by maximizing a sum of transverse plane signals.

At block 1310, an RF pulse shape is calculated (e.g., by the RF pulse shape calculator 144). In some embodiments, the RF pulse shape is calculated to make the spatial excitation more constant. In some implementations, this is accomplished by calculating the shaped RF pulse by applying a magnitude least squares (MLS) problem to a set of RF pulses that satisfy a peak amplitude constraint.

At block 1315, a RF pulse sequence (e.g., 234 of FIG. 2A) is determined (e.g., by the RF pulse sequence determiner 146). The RF pulse sequence may be determined in any suitable manner, and to be any suitable sequence. For example, the RF pulse sequence may be determined simply by setting the RF pulse shape (e.g., determined at block 1310) to occur a predetermined number of times (e.g., 32 times, as in the example of FIG. 2A). Additionally or alternatively, the determined RF pulse may have different shapes, magnitudes, etc. throughout the RF pulse sequence. Furthermore, the RF pulse sequence may be determined such that the RF pulse sequence induces the flip angle(s) calculated at block 1305.

At block 1320, the gradient waveform (e.g., 232 of FIG. 2A) is determined (e.g., by the gradient waveform determiner 148). The gradient waveform may be determined in any suitable manner, and to be any suitable waveform. For instance, the gradient waveform may be calculated to induce the overlapping echoes that are used by the disclosed techniques to reconstruct the MRI image and/or rate map.

At block 1325, the determined gradient waveform and RF pulse sequence are applied. For example, the one or more processors 135 (e.g., via the MRI controller 150) may control the gradient coil 122 to apply the gradient waveform, and control the RF transmit coil 124 to apply the RF pulse sequence.

At block 1330, the FID signal is collected. Any suitable component or combination of components may collect the FID signal. For example, the one or more processors 135 (e.g., via the MRI controller 150 and/or MRI data acquirer 152) may control the RF receive coil 126 to receive the FID signal, and store the FID signal (e.g., at the MRI data acquirer 152, etc.). In one example, this occurs during the FID signal collection phase 210 of FIG. 2A.

In some embodiments, blocks 1325 and 1330 are iteratively applied and/or are applied simultaneously. For instance, as in the example of FIG. 2A, there may be RF pulses RF1, RF2, and RF3, which each, respectively, may be followed very closely by the collections at FID1, FID2, and FID3.

At block 1335, the one or more processors 135 (e.g., via the MRI controller 150) ends the RF pulse sequence, but continues to apply the gradient waveform (e.g., the system enters phase 220 of the example of FIG. 2A).

At block 1340, the GRE signal (e.g., a plurality of echo signals) is collected. Any suitable component or combination of components may collect the GRE signal. For example, the one or more processors 135 (e.g., via the MRI controller 150 and/or MRI data acquirer 152) may control the RF receive coil 126 to receive the GRE signal, and store the GRE signal (e.g., at the MRI data acquirer 152, etc.). In one example, this occurs during the GRE signal collection phase 220 of FIG. 2A.

After block 1340, example method 1300 may enter the reconstruction phase 1320. That is, the system has sufficiently acquired MRI data during the acquisition phase 1301, and may proceed to reconstruct the MRI image, or rate map.

At block 1345, the one or more processors 135 (e.g., via the reconstructor 154) builds an echo-in signal matrix. In one example, the echo-in signal matrix corresponds to $A_1$ of eq. (6), and is built generally according to eq. (7). In some embodiments, the one or more processors also apply weight(s) in the echo-in signal matrix. For example, weights may be applied to a particular row or column of the echo-in signal matrix. In some embodiments, the weights correspond to the basis spectrum function shown in eq. (33), or the spectrum of a Gaussian, Sinc, or B-Spline basis function. In some embodiments, a Fermi function or other function that is a decreasing function of spatial frequency is used to calculate the weights. In some embodiments, the weights are determined by how overlapping echoes are interleaved. For example, in fMRI protocol, the cutoff frequency for the echo-in matrix may be selected to prevent the high-frequency of the echo-in signal from being distorted to overfitting to the low-frequency noise of the echo-out signal.

At block 1350, the one or more processors 135 (e.g., via the reconstructor 154) builds an echo-out signal matrix. In one example, the echo-out signal matrix corresponds to $A_2$ of eq. (6), and is built generally according to eq. (7). In some embodiments, the one or more processors also apply weight(s) in the echo-out signal matrix. For example, weights may be applied to a particular row or column of the echo-out signal matrix.

At block 1355, the one or more processors 135 (e.g., via the reconstructor 154) builds a FID signal matrix. In one example, the echo-out signal matrix is built generally according to eq. (7). In some embodiments, the one or more processors also apply weight(s) in the FID signal matrix. For example, weights may be applied to a particular row or column of the FID signal matrix.

At block 1360, the one or more processors 135 (e.g., via the reconstructor 154) builds a system matrix. The system matrix may be built in any suitable way. For example, any or all of the echo-in signal matrix, the echo-out signal matrix, and/or the FID signal matrix may be summed to create the system matrix. In some embodiments, the system matrix may be an echo signal system matrix (e.g., $A_g$ of eq. (9)) and/or a FID system matrix (e.g., $A_f$ of eq. (9)).

In addition, the system matrix may include echoes beyond the echo-in and echo-out. For example, although not illustrated in the example flowchart of FIG. 13, additional echo signals may be collected, and corresponding echo matrixes may be built for them. In one example implementation of this, the system matrix may be constructed by summing all of the built matrixes.

In some embodiments, the system matrix is built based on only the echo-in matrix and the echo-out matrix (e.g., built based only on GRE signals); and the system matrix is not built based on a FID signal matrix. However, in other embodiments, the system matrix is built based on a joint reconstruction technique (e.g., a joint reconstruction of GRE and FID signals). For example, the system matrix may be built by summing the echo signal matrix(es) and the FID signal matrix.

At block 1365, the one or more processors 135 (e.g., via the reconstructor 154) reconstructs the MRI image and/or rate map (e.g., an image of a rate(s)). In some embodiments, the MRI image and/or rate map may be reconstructed based only on one of either echo signal(s) or the FID signal. This may be implemented, for example, according to eq. (8). In one example implementation of this, the elements of (s−Ax) in eq. (8) may be weighted. However, in other embodiments, the may be joint reconstruction (e.g., reconstruction based on both echo signal(s) and the FID signal). In some example implementations, the joint reconstruction may be done according to eqs. (9)-(11). It should further be appreciated that this discussion applies equally to reconstructing one or more MRI images (e.g., applies to fMRI, etc.).

In some embodiments, the rate map illustrates the decay rate. In some embodiments, the rate map is reconstructed further based on information in addition to the system matrix and/or initial group of echo pulses. For example, the FID signal may be used in the reconstruction of the rate map. In another example, a subsequent echo train (e.g., group of echo pulses) may be used in the reconstruction of the rate map. For instance, the subsequent echo train may be collected after an initial group of echo pulses (e.g., an initial echo train) is collected.

In some embodiments that calculate a shaped sequence of RF pulses, the reconstruction may be done further according to an excitation profile (e.g., in matrix form) of the calculated shaped sequence of RF pulses.

Further regarding the example flowchart provided above, it should be noted that all blocks are not necessarily required to be performed. Moreover, additional blocks may be performed although they are not specifically illustrated in the example flowchart.

Time Frame Splitting Examples

The looping-star MRI has a high undersampling factor. Therefore, in some looping-star MRI methods, the volume repetition time (TR) must be increased to collect more k-space data and reduce undersampling artifacts at the cost of worse temporal resolution. To compensate for this degraded temporal resolution, some embodiments described herein advantageously implement a time frame splitting technique. For example, some such embodiments (e.g., that split the time windows by 2, etc.) improve the temporal resolution by a factor of 2. Even further advantageously, some such embodiments reduce the undersampling artifact due to the alternating sampling patterns.

To demonstrate the effectiveness of such embodiments, an experiment was conducted using the pulse sequence of FIG. 2E. The experiment first used a 3-dimensional (3D) generalized golden-angle-based rotation [Chan, R. W., Ramsay, E. A., Cunningham, C. H., & Plewes, D. B. (2009). Temporal stability of adaptive 3D radial MRI using multidimensional golden means. Magnetic Resonance in Medicine: An Official Journal of the International Society for Magnetic Resonance in Medicine, 61(2), 354-363.] instead of random rotation to achieve a more uniform distribution of spokes in k-space. Second, the experiment reduced the number of RF pulses to 23 with increased sampling time, which improves the spatial resolution from 3.75 mm to 3 mm. Third, because higher spatial resolution requires more spokes in k-space, the experiment increased the volume TR to 3.6 sec to reduce the undersampling artifact. The same sampling pattern was repeated every volume TR to minimize the impact of the sampling pattern on fMRI signals.

Problem formulation for the experiment: In looping-star MRI, gradient echoes are overlapped in the time domain due to multiple RF pulses. Therefore, the following signal model may be used to account for multiple echoes:

$$S_j(t) = \int C_j(r)f(r) = \sum_{l=1}^{L} e^{-i2\pi k(r) \cdot t_l} dr \qquad \text{eq. (34)}$$

Where $c_j(r)$ is the sensitivity map of jth receiver coil, is the continuous $$T_2^* -$$

-weighted object, and L is the number of RF pulses that were applied before time $t_l$. This signal model fully models both echo-in and echo-out spokes and resolves the overlapping echo problems.

Reconstruction: The experiment used CG-SENSE with a spatial 3D quadratic roughness regularizer for reconstruction. Each frame from the scan was reconstructed independently as a reference. For the spatial-temporal reconstruction, the experiment first split every frame into two subframes with equal duration and separately reconstructed each sub-frame. The experiment then used "unaliasing by Fourier-encoding the overlaps in the temporal dimension" (UNFOLD) to remove the undersampling artifact from the alternating sampling pattern.

The experiment compared the disclosed model-based image reconstruction (MBIR) with 1) lower temporal resolution, 2) higher temporal resolution before UNFOLD filtering, and 3) higher temporal resolution after UNFOLD filtering. In the fMRI study, participants watched a flashing checkerboard for multiple cycles (20 s on and 20 s off), and were required to tap their fingers while the checkerboard was on. The pulse sequences were programmed via TOPPE [Nielsen, J. F., & Noll, D. C. (2018). TOPPE: A framework for rapid prototyping of MR pulse sequences. Magnetic resonance in medicine, 79(6), 3128-3134.] and implemented on a GE UHP 3.0T scanner with a Nova 32RX head coil. Subjects gave informed consent under Institutional Review Board (IRB) approval.

FIGS. 14A, 14B, and 14C show the time series of a looping-star fMRI task. More particularly, FIG. 14A shows the time course from the original looping-star with low temporal resolution; FIG. 14B shows the overlapping echo effect from the looping-star with high temporal resolution before UNFOLD is applied; and FIG. 14C shows the effects of applying UNFOLD. It may be seen from FIG. 14C that the undersampling artifact in FIG. 14B due to the repeating sampling pattern is significantly reduced after applying UNFOLD, leading to increased temporal resolution and reduced undersampling artifact. It may be noted that the temporal resolution of FIG. 14A is ~3.6 seconds; the temporal resolution of FIG. 14B is ~1.8 seconds; and the temporal resolution of FIG. 14C is ~1.8 seconds. In this way, the timeframes between FIGS. 14A and 14B are "split." Due to the high undersampling rate, FIG. 14B (e.g., before applying UNFOLD) shows significant signal oscillation from the different sampling trajectories when the time is reduced for each frame. After removing the undersampling artifact in the k-t domain using UNFOLD, the oscillations are mostly removed and temporal resolution is also improved, as shown by FIG. 14C.

FIG. 15A shows the FFT of the time course of a typical activated voxel. There is a significant high-frequency component because the undersampling artifact oscillates between adjacent frames. Before UNFOLD, the raw activation map (FIG. 15B) does not reflect the true brain activity due to the undersampling artifacts. After UNFOLD, even by only removing a single frequency component, the new activation map (FIG. 15C) shows higher correlation coefficients and recovered activities. Similarly to the difference between FIGS. 14A and 14B, the difference between FIGS. 15A and 15B is that the time window is "split" by a factor of two.

FIGS. 16A, 16B and 16C show Sagittal activation maps for the visual stimulus. Similarly to the difference between FIGS. 14A and 14B, the difference between FIGS. 16A and 16B is that the time window is "split" by a factor of two; put another way, FIG. 15B illustrates a halved TR volume of FIG. 15A. Improving the temporal resolution by a factor of two (e.g., going from FIG. 16A to FIG. 16B) initially greatly reduces activation due to the increased noise from the undersampling artifacts. However, after removing the undersampling artifact using UNFOLD (e.g., after removing a single frequency corresponding to the 1.8 s), the activation map is improved back to the level of the original reconstruction, but with doubled temporal resolution.

FIGS. 17A, 17B, 17C show the activation maps for the finger-tapping tasks described above. Similar to the visual task, using UNFOLD recovers brain activities by reducing the undersampling artifact. FIG. 17A shows the original frame-wise construction. FIG. 17B shows a halved volume TR of the data of FIG. 17A without UNFOLD. FIG. 17C shows a halved TR volume of the data of FIG. 17A with UNFOLD applied. Similarly to the visual task, using UNFOLD recovers brain activities by reducing the undersampling artifact.

Moreover, it should be appreciated that although the examples above with respect to FIGS. 14A-17C include splitting time windows by a factor of two, splitting the time windows by any factor is possible.

As demonstrated on both visual and motor tasks, embodiments disclosed herein demonstrate improvement in the temporal resolution and reduction of undersampling artifacts, at a negligible cost to temporal resolution from removing a single frequency component. For further study, more advanced spatial-temporal models can be explored to reduce undersampling artifacts for repeating and non-repeating sampling patterns.

To further elaborate on UNFOLD, UNFOLD may be a temporal strategy that involves changing the k-space sampling pattern from frame to frame, and applying temporal filters [B. Madore, G. H. Glover, and N. J. Pelc. "Unaliasing by Fourier-encoding the overlaps using the temporal dimension (UNFOLD), applied to cardiac imaging and fMRI". In: Magnetic Resonance in Medicine: An Official Journal of the International Society for Magnetic Resonance in Medicine 42.5 (1999), pp. 813-828]. In some embodiments, the UNFOLD filter may be chosen carefully to filter only a narrow frequency band related to the undersampling pattern, while preserving the remainder of the temporal resolution. It should be appreciated that this thus effectively filters out the functional activities from the undersampling artifacts.

Low-rank matrix completion is an extension of the compressed sensing technique that enables the recovery of missing or corrupted entries of a matrix under low-rank and incoherence conditions. In contrast to sparse signals or images, which only have a few large coefficients, low-rank matrices only have a few large singular values, depending on a smaller number of degrees of freedom, making undersampling possible.

To further improve results, low-rank matrix completion may be used. Low-rank matrix completion may be performed by minimizing the nuclear norm of the matrix (sum of singular values), which is the analog of the L1-norm for signal vectors (sum of absolute values). This technique has been successfully applied to dynamic MRI by considering each temporal frame as a column of a space-time matrix, where the spatiotemporal correlations produce a low-rank matrix. (Tensor models are also of interest, in addition to low-rank matrix models [S. Guo, J. A. Fessler, and D. C. Noll. "High-resolution oscillating steady-state fMRI using patch-tensor low-rank reconstruction". In: IEEE transactions on medical imaging 39.12 (2020), pp. 4357-4368].) Local k-space correlations in a multi-coil data set have also been exploited to perform calibrationless parallel-imaging reconstruction via low-rank matrix completion.

The combination of compressed sensing and low-rank matrix completion represents an attractive proposition for further increases in imaging speed. In dynamic MRI, previous work on this combination proposed finding a solution that is both low rank and sparse [S. G. Lingala, Y. Hu, E. DiBella, and M. Jacob. "Accelerated dynamic MRI exploiting sparsity and low-rank structure: kt SLR". In: IEEE transactions on medical imaging 30.5 (2011), pp. 1042-1054], [ B. Zhao, J. P. Haldar, A. G. Christodoulou, and Z.-P.

Liang. "Image reconstruction from highly undersampled (k, t)-space data with joint partial separability and sparsity constraints". In: IEEE transactions on medical imaging 31.9 (2012), pp. 1809-1820].

The combination of the disclosed model-based reconstruction approach for overlapping echoes with spatio-temporal image reconstruction models (such as the low-rank and low-rank+sparse models) improves dynamic image reconstruction for looping star MRI.

Simplified Math Aspects

Signal Models in Looping-Star

Some embodiments use slightly simplified forms of the equations. For example, some embodiments approximate the object magnetization $f(\vec{r})$ using a finite series expansion as follows:

$$f(\vec{r}) = \sum_{n=0}^{N-1} f_n b(\vec{r} - \vec{r}_n) \qquad \text{eq. (35)}$$

Where $b(\cdot)$ denotes the object basis function, typically a voxel indicator function, $\vec{r}_n$ denotes the center of nth translated basis function, and $N$ is the number of parameters (voxels).

In looping-star fMRI, assuming $N_{rf}$ RF pulses in one cycle of FID and following GRE, there will be up to $N_{rf}$ k-space trajectories, each corresponding to a previously applied RF pulse. Therefore, the GRE signal sampled at any time t is a superposition of $N_{rf}$ k-space samples located on corresponding trajectories.

The corresponding signal equation for the ith spoke ($i=1, \ldots, N_{rf}$) and jth receiver coil ($j=1, \ldots, J$) is given by [Fessler J A. Model-based image reconstruction for MRI. IEEE signal processing magazine. 2010; 27(4):81-89.]

$$s_{ij}(t) = \int c_j(\vec{r}) f(\vec{r}) \left( \sum_{l=1}^{N_{rf}} e^{-z(\vec{r})(t+(i-l)\Delta t)} e^{-i2\pi\vec{k}_l(t+(i-l)\Delta t)\vec{r}} \right) d\vec{r} \qquad \text{eq. (36)}$$

Where a continuous time index t is the time for the ith spoke starting from the end of the ith RF pulse, $c_j(\vec{r})$ is the sensitivity map of jth receiver coil, $f(\vec{r})$ is the unknown continuous complex transverse magnetization, $$z(\vec{r}) \triangleq \frac{1}{T_2^*(\vec{r})} + i\Delta\omega_0(\vec{r})$$

is the "rate map", $\Delta t$ is the time interval between adjacent RF pulses, $(i-l)\Delta t$ is the time between the ith and lth RF pulse, and $\vec{k}_l(t)$ is the k-space trajectory for the lth RF pulse at time t.

Each l represents a RF pulse that contributes to the signal. When l=i, the corresponding k-space trajectory $\vec{k}_i(t)$ moves from the center k-space to outer k-space, which is called echo-out trajectory, and when l=i+1, the corresponding k-space trajectory $\vec{k}_{i+1}(t-\Delta t)$ moves from the outer k-space to center k-space, which is called echo-in trajectory.

After space discretization [Sutton B P, Noll D C, Fessler J A. Fast, iterative image reconstruction for MRI in the presence of field inhomogeneities. IEEE transactions on medical imaging. 2003; 22(2):178-188.] using eq. (35), eq. (36) may be approximated by $$s_{ij}(t) = \sum_{l=1}^{N_{rf}} B\left(\vec{k}_l(t + (i-l)\Delta t)\right) \qquad \text{eq. (37)}$$

$$\sum_{n=0}^{N-1} c_j(\vec{r}_n) f(\vec{r}_n) e^{-z(\vec{r}_n)(t+(i-l)\Delta t)} e^{-i2\pi\vec{k}_l(t+(i-l)\Delta t)\cdot\vec{r}_n}$$

Where $B(\vec{k}(\bullet))$ denotes the spectrum of the object basis function $b(\bullet)$.

Some embodiments express the noisy measured signals for ith spoke and ith coil in matrix-vector form as follows $$s_{ij}(t) = \left(\sum_{l=1}^{N_{rf}} A_{il}\right) C_j f + \epsilon_{ij} \in \mathbb{C}^M \qquad \text{eq. (38)}$$

Where $f=(f_1, \ldots, f_N)$ is the vector of parameters (voxel values) that the goal is to estimate from the measurement s, $C_j \in \mathbb{C}^{N \times N}$ is the diagonal sensitivity map matrix, and each element of the matrix $A_{il} \in \mathbb{C}^{M \times N}$ is given by $$a_{ilmn} = B\left(\vec{k}_l(t_m + (i-l)\Delta t)\right) e^{-z(\vec{r}_n)(t_m + (i-l)\Delta t)} e^{-i2\pi\vec{k}_l(t_m + (i-l)\Delta t)\cdot\vec{r}_n} \qquad \text{eq. (39)}$$

Where i is the spoke index, j is the coil index, I is the RF pulse index, m is the index for a discrete time point in k-space, and n is the index for discrete image grid.

Stacking up all J measurement vectors and sensitivity map matrices from all coils and defining the system matrix for the ith echo to be $$A_i = \sum_{l=1}^{N_{rf}} A_{il} \in \mathbb{C}^{M \times N}$$

yields the linear model $$s_i = (I_J \otimes A_i) C f + \epsilon_i \qquad \text{eq. (39)}$$

Where $C=[C_1; \ldots ; C_J]$ and $\otimes$ denotes the Kronecker product.

To perfectly model all the spokes, the optimal signal model would take all those k-space locations into account. However, modeling all the spokes would require approximately 512 cubic spatial resolution and in practice is computationally infeasible, especially in fMRI scans with many time frames. Some embodiments disclosed herein simplify the signal model to include only signals from echo-in spokes and echo-out spokes. Specifically, eq. (39) may be simplified to $$s_i = (I_J \otimes \tilde{A}_i) C f + \epsilon_i \qquad \text{eq. (40)}$$

Where the two-term approximation $$\tilde{A}_i = \sum_{l \in \{i, i+1\}} A_{il}$$

is used. Here l=i+1 corresponds to the echo-in spoke and l=l corresponds to the echo-out spoke.

Model-Based Reconstruction

With the above discrete system matrix, some embodiments use the conjugate gradient method to optimize the following cost function $$\hat{f} = \arg\min_f \|s - ACf\|_2^2 + \beta R(f) \qquad \text{eq. (41)}$$

Where $s=[s_1; \ldots ; s_{N_{rf}}]$ is the vertically stacked signal, $A=[(I \otimes \tilde{A}_1; \ldots ; (I \otimes \tilde{A}_{N_{rf}}]$ is the stacked system matrix, and $R(\bullet)$ is a 3D roughness regularizer with 26 neighbors. Some embodiments use CG-SENSE [Pruessmann K P, Weiger M, Börnert P, Boesiger P. Advances in sensitivity encoding with arbitrary k-space trajectories. Magnetic Resonance in Medicine. 2001; 46(4):638-651.] with 30 iterations to optimize eq. (41).

k-Space Filtering and Object Basis Spectrum

To reduce or remove overlapping echo artifact using the traditional gridding method, a k-space filter may be applied to the signal in which high-frequency components from echo-in spokes are mixed with low-frequency components from the echo-out spokes. This filter reduces the low frequency contamination of high frequency signals. In some embodiments, either a hard threshold is used to truncate, or a Fermi filter is used to suppress the k-space data with a k-space window at approximately 50% [Dionisio-Parra B, Wiesinger F, Sämann P G, Czisch M, Solana A B. Looping star fMRI in cognitive tasks and resting state. Journal of Magnetic Resonance Imaging. 2020; 52(3)139-751.].

For model-based reconstruction, instead of filtering out the mixed signals, some embodiments model the echo-in and echo-out mixture using an object basis function whose spectrum B(k) is Fermi shaped with a cutoff frequency around 90%. Some embodiments use this 90% cutoff frequency because the magnitude of low-frequency components near the k-space origin is much larger than the magnitude of the high-frequency components; therefore when these two signals are superimposed, it is very difficult to recover the high-frequency components accurately.

Implementation and Reproducible Research

Some embodiments used TOPPE [Nielsen J F, Noll D C. TOPPE: A framework for rapid prototyping of MR pulse sequences. Magnetic resonance in medicine. 2018; 79(6): 3128-3134.] to program the looping-star pulse sequence on a GE UHP 3.0T scanner with a Nova Medical 32-channel Rx head coil.

Some embodiments compared the proposed model-based reconstruction (e.g., MB-2 as will be described further with respect to the example of FIG. 19D, etc.) to a simpler model-based reconstruction method that used a single system matrix, $A_1$ (e.g., MB-1 as will be described further with respect to the example of FIG. 19C) and a gridding method that used a density compensation function and an over-sampling factor of 2.

Some embodiments then apply a sensitivity map based complex coil combination to construct the final images. Some embodiments tested the structural MRI protocol on three subjects and variants of the fMRI protocol on four subjects. Subjects gave informed consent under IRB approval.

For model-based reconstruction, some embodiments used the Matlab toolbox MIRT [Fessler J A. "Michigan Image Reconstruction Toolbox (MIRT)" https://web.eecs.umi-ch.edu/~fessler/code/index.html.] to build the NUFFT-based system matrix and optimize the cost function.

US 12,625,211 B2

29                                                    30

Overlapping Echo Artifacts Demonstration

FIG. 18 illustrates the resultant effect for overlap of the echo-in and echo-out spokes. For k-space filter with a cutoff of 0.5, there is little artifact, but resolution is lowered by roughly a factor or two in all three directions. For higher cutoffs, there is a tradeoff between spatial resolution and artifact resulting from misassigned spatial frequency components. As the k-space threshold increases, the overlapping echo artifact may significantly degrade the image quality.

Phantom Experiments

FIGS. 19A-19D show the reconstruction for structured phantom using a hi-resolution looping-star protocol. More particularly, FIG. 19A depicts standard $$T_2^*$$

-weighted GRE (scan time: 21 min). FIG. 19B depicts gridding reconstruction with density compensation function. FIG. 19C depicts MB-1 without overlapping echo modeling. FIG. 19D depicts MB-2 with overlapping echo modeling. FIGS. 19B-19D all use the same k-space data with scan time of about 7 minutes. FIG. 19D shows similar spatial resolution (slightly reduced due to voxel indicator function and spherical acquisition pattern) to the standard GRE, and improved image quality compared to FIG. 19B and FIG. 19C in terms of sharper edges (boxes 1910) and recovered signal loss (boxes 1920).

Some embodiments compare the standard gradient echo reconstruction results to looping-star reconstruction using gridding, model-based reconstruction without modeling overlapping signal (MB-1), and model-based method with overlapping signal modeling (MB-2). MB-2 significantly improved the spatial resolution by modeling the high-frequency components in sampled signals. Signal loss near the phantom-air edges is also recovered due to the spatial resolution improvement.

In-Vivo Experiments—Structural MRI

FIG. 20 shows an example reconstruction for a human brain scan in a representative example subject using the high-resolution protocol. For the gridding method, overlapping echo artifact was reduced by truncating the k-space, which also reduced the spatial resolution. The proposed MB-2 shows reduced overlapping echo artifacts as well as improved image quality. Besides the sharper images, the signal loss around frontal sinuses and ear canals is recovered due to the smaller voxel size.

In-Vivo Experiments—Functional MRI

Some implementations described herein demonstrated application of the proposed methods to fMRI by doing finger-tapping and visual fMRI tasks. In the fMRI study, healthy participants watched a flashing checkerboard for multiple cycles (20 s on and 20 s off), and were required to tap their fingers while the checkerboard was on. FIG. 21 shows the activation map and time course for the finger-tapping test in a typical subject. The proposed MB-2 reconstruction method showed higher correlation and less noise on the activation map. Its time course also better matches the task reference and is less noisy.

With further respect to FIG. 21, first row 2110 shows the time course from the voxel with the highest correlation coefficient. With the improved spatial resolution, time course in MB-2 shows larger signal change due to the reduced partial volume effect. Second row 2120 shows a sagittal activation map for visual tasks (two consecutive slices). Although the undersampling artifact (20× undersampled) dominates the artifacts here, MB-2 reconstruction still shows slightly improved spatial resolution. With gridding method, the activation map is smoothed and potentially shows false positives. Third row 2130 depicts an axial activation map for finger-tapping tasks (two consecutive slices).

The traditional gridding method either suffers from low-spatial resolution and less signal change due to partial volume effects by truncating too much (truncation to 0.5 $k_{max}$), or suffers from overlapping echo artifacts and more noise by truncating too little. The proposed MB-2 methods shows improved spatial resolution (about 1.8× expected relative to the lower resolution gridding), larger signal change, and better activation compared to previous methods. The longer effective readouts for MB-2 may improve the SNR by a factor of $\sqrt{1.8}$, thus leading to a net SNR reduction of $\sqrt{1.8}/1.8^3$ compared to the gridding method, where the $1.8^3$ comes from the reduced 3D voxel size. Still, the fMRI results do not appear to be limited by thermal noise.

Further Discussion of the Simplified Math and Example Experiments

Compared to the standard GRE method, the biggest disadvantage of looping-star is the low SNR that limits its spatial and temporal resolution. By exploiting the high-frequency k-space information, embodiments disclosed herein may resolve the overlapping echoes and use about twice as many signal samples for reconstruction, which also improves the SNR by a factor of nearly $\sqrt{2}$. However, since the high-frequency signal values are mixed with the low-frequency signals, which have a much larger magnitude, it is difficult to accurately estimate the highest-frequency components. To overcome this problem, some embodiments use an object basis spectrum based on a Fermi function that effectively leads to a slight truncation of the high-frequency components (≈90%) at the end of the echo-in and echo-out spokes acquisition. This approach reduced the image distortion coming from the mis-estimation of the highest-frequency signals.

One other reconstruction method such as RF-cycling [Wiesinger F, Menini A, Solana A B. Looping star. Magnetic resonance in medicine. 2019; 81(1):57-68] leads to reduced temporal resolution. Another approach is coherence-resolved looping-star [Damestani N, Lythgoe D J, Solana A B et al. Coherence-resolved Looping Star improvements for silent multi-gradient echo structural and functional neuroimaging. In: Proceedings of the 30th Annual Meeting of the ISMRM:2677; 2021; Online.], which removes most of the overlapping echo artifacts by pushing further in k-space before the next RF pulse is applied. This by done by increasing the gradient strength for a fixed number of RF pulses, thus increasing acquisition bandwidth, resulting in reduced SNR. Alternatively, the coherence-resolved approach can be implemented by reducing the number of RF pulses, which can maintain the SNR, but increases under-sampling artifact by reducing the number of spokes. In all of these approaches, there is a loss of image quality, SNR or temporal resolution.

Some embodiments disclosed herein used 3D golden-angle based sampling trajectories to achieve more uniformly distributed the spokes. The performance of randomly rotated spokes highly depends on the random seed, so the image quality in each frame of fMRI studies would differ significantly if different sampling patterns for each frame were used. Accordingly, some embodiments repeated the a single 3D pattern for all fMRI temporal frames.

31
Exemplary Embodiments

Aspect 1. A method for use in $$T_2^*$$

weighted magnetic resonance imaging (MRI) image recon-
struction, the method comprising:
  collecting, via one or more processors, a plurality of echo
    signals, the plurality of echo signal being created by a
    MRI machine: (i) applying a gradient magnetic field to
    a subject, and (ii) applying a sequence of radio fre-
    quency (RF) pulses to the subject, wherein the plurality
    of echo signals are collected in a phase during which
    the sequence of RF pulses are not being applied to the
    subject;
  building, via the one or more processors, an echo-in signal
    matrix based on k-space sampling locations;
  building, via the one or more processors, an echo-out
    signal matrix based on the k-space sampling locations;
  summing, via the one or more processors, the echo-in
    signal matrix with the echo-out signal matrix to create
    a system matrix that models overlapping echoes; and
  reconstructing, via the one or more processors, a MRI
    image and/or rate map based on the system matrix, and
    the collected plurality of echo signals.
Aspect 2. The method of aspect 1, further comprising:
  collecting, via the one or more processors, a free-induc-
    tion-decay (FID) signal, the FID signal being a signal
    that is created by the MRI machine applying: (i) the
    gradient magnetic field to the subject, and (ii) the
    sequence of RF pulses to the subject, wherein the FID
    signal is collected in a phase during which the sequence
    of RF pulses are being applied to the subject; and
  building, via the one or more processors, a FID signal
    matrix based on the k-space sampling locations; and
  wherein the reconstruction of the MRI image and/or rate
    map is based further on the FID signal matrix, and/or
    collected FID signal.
Aspect 3. The method of any one of aspects 1-2, wherein
the reconstruction of the MRI image and/or rate map com-
prises reconstructing the rate map further based on a free-
induction-decay (FID) signal.
Aspect 4. The method of any one of aspects 1-3, further
comprising:
  calculating, via the one or more processors, a series of
    optimized flip angles by maximizing a sum of trans-
    verse plane signals wherein the applying the sequence
    of RF pulses to the subject comprises applying the
    sequence of RF pulses such that the sequence of
    constant RF pulses induces the series of optimized flip
    angles;
  collecting, via the one or more processors, a free-induc-
    tion-decay (FID) signal, the FID signal being a signal
    that is created by the MRI machine applying: (i) the
    gradient magnetic field to the subject, and (ii) the
    sequence of RF pulses to the subject, wherein the FID
    signal is collected in a phase during which the sequence
    of RF pulses are being applied to the subject; and
  building, via the one or more processors, a FID signal
    matrix based on the k-space sampling locations; and
  wherein the reconstruction of the MRI image and/or rate
    map is based further on the FID signal matrix, and/or
    the collected FID signal.

32
Aspect 5. The method of any one of aspects 1-4, further
comprising:
  calculating, via the one or more processors, a shaped
    sequence of RF pulses for more constant spatial exci-
    tation, wherein the applying the sequence of RF pulses
    comprises applying the shaped sequence of RF pulses;
  collecting, via the one or more processors, a free-induc-
    tion-decay (FID) signal, the FID signal being a signal
    that is created by the MRI machine applying: (i) the
    gradient magnetic field to the subject, and (ii) the
    shaped sequence of RF pulses, wherein the FID signal
    is collected in a phase during which the shaped
    sequence of RF pulses are applied to the subject; and
  building, via the one or more processors, a FID signal
    matrix based on the k-space sampling locations; and
  wherein the reconstruction of the MRI image and/or rate
    map is based further on the FID signal matrix, a shaped
    excitation profile of the calculated shaped sequence of
    RF pulses, and/or the collected FID signal.
Aspect 6. The method of any one of aspects 1-5, wherein:
  the building of the echo-in signal matrix further comprises
    applying weights to at least one row of the echo-in
    signal matrix; and
  the building of the echo-out signal matrix further com-
    prises applying weights to at least one row of the
    echo-out signal matrix.
Aspect 7. The method of any one of aspects 1-6, wherein
the reconstruction of the MRI image and/or rate map is done
according to an argument of the minimum equation that
takes the system matrix, and the collected plurality of echo
signals as inputs.
Aspect 8. The method of any one of aspects 1-7, wherein
the reconstruction of the MRI image and/or rate map is done
according to an argument of the minimum equation with
weighted elements.
Aspect 9. The method of any one of aspects 1-8, wherein
the echo-in signal matrix, and the echo-out signal matrix are
built according to the equation:

$$a_{lij} = \int b(\vec{r} - \vec{r}_j) c(\vec{r}) e^{-z(\vec{r}) t_{l,i}} e^{-i2\pi \vec{k}_l(t_{l,i}) \vec{r}} d\vec{r}$$

where:
  l=1 builds the echo-in signal matrix;
  l=2 builds the echo-out signal matrix;
  b(•) is an object basis function;
  c($\vec{r}$) is a sensitivity map of a receiver coil;
  z($\vec{r}$) is a rate map; and
  $e^{-i2\pi \vec{k}_l(t_{l,i}) \cdot \vec{r}}$ denotes a non-uniform fast Fourier transform
    (NUFFT).
Aspect 10. A device for use in $$T_2^*$$

weighted magnetic resonance imaging (MRI) image recon-
struction, the device comprising one or more processors
configured to:
  collect plurality of echo signals, the plurality of echo
    signals being a plurality of signals that are created by
    a MRI machine: (i) applying a gradient magnetic field
    to a subject, and (ii) applying a sequence of radio
    frequency (RF) pulses to the subject, wherein the one
    or more processors are further configured to collect in a phase during which the sequence of RF pulses are not being applied to the subject;

build an echo-in signal matrix based on the k-space sampling locations;

build an echo-out signal matrix based on the k-space sampling locations;

sum the echo-in signal matrix with the echo-out signal matrix to create a system matrix that models overlapping echoes; and reconstruct a MRI image and/or rate map based on the system matrix, and the collected plurality of echo signals.

Aspect 11. The device of aspect 10, wherein the one or more processors are further configured to:

collect a free-induction-decay (FID) signal, the FID signal being a signal that is created by the MRI machine applying: (i) the gradient magnetic field to the subject, and (ii) the sequence of RF pulses to the subject, wherein the one or more processors are configured to collect the FID signal in a phase during which the sequence of RF pulses are applied to the subject; and build a FID signal matrix based on the k-space sampling locations; and wherein the reconstruction of the MRI image and/or rate map is based further on the FID signal matrix, and/or the collected FID signal.

Aspect 12. The device of any one of aspects 10-11, wherein the one or more processors are further configured to reconstruct the rate map further based on a free-induction-decay (FID) signal.

Aspect 13. The device of any one of aspects 10-12, wherein the one or more processors are further configured to:

calculate a series of optimized flip angles by maximizing a sum of transverse plane signals;

apply the sequence of RF pulses to the subject by applying the sequence of RF pulses such that the sequence of constant RF pulses induces the series of optimized flip angles;

collect a free-induction-decay (FID) signal, the FID signal being a signal that is created by the MRI machine applying: (i) the gradient magnetic field to the subject, and (ii) the sequence of RF pulses to the subject, wherein the one or more processors are configured to collect the FID signal in a phase during which the sequence of RF pulses are applied to the subject; and build a FID signal matrix based on the k-space sampling locations; and wherein the reconstruction of the MRI image and/or rate map is based further on the FID signal matrix, and/or collected FID signal.

Aspect 14. The device of any one of aspects 10-13, wherein the one or more processors are further configured to:

calculate a shaped RF pulse for more constant spatial excitation;

collect a free-induction-decay (FID) signal, the FID signal being a signal that is created by the MRI machine applying: (i) the gradient magnetic field to the subject, and (ii) the shaped RF pulse; and build a FID signal matrix based on the k-space sampling locations; and wherein the reconstruction of the MRI image and/or rate map is based further on the FID signal matrix, a shaped excitation profile of the calculated shaped sequence of RF pulses, and/or the collected FID signal.

Aspect 15. The device of any one of aspects 10-14, wherein the one or more processors are further configured to:

build the echo-in signal matrix further by applying weights to at least one row of the echo-in signal matrix; and build the echo-out signal matrix further by applying weights to at least one row of the echo-out signal matrix.

Aspect 16. The device of any one of aspects 10-15, wherein the one or more processors are further configured to reconstruct the MRI image and/or rate map according to an argument of the minimum equation that takes the system matrix as an input.

Aspect 17. The device of any one of aspects 10-16, wherein the one or more processors are further configured to reconstruct the MRI image and/or rate map according to an argument of the minimum equation with weighted elements.

Aspect 18. A system for use in $$T_2^*$$

weighted magnetic resonance imaging (MRI) image reconstruction, the system comprising:

one or more processors;

a gradient coil;

at least one radio frequency (RF) transmit coil;

at least one RF receive coil; and one or more memories coupled to the one or more processors;

the one or more memories including computer executable instructions stored therein that, when executed by the one or more processors, cause the one or more processors to:

collect a plurality of echo signals, the plurality of echo signals being a plurality of signals that are created by a MRI machine: (i) applying a gradient magnetic field to a subject, and (ii) applying a sequence of RF pulses to the subject, wherein the one or more memories including computer executable instructions stored therein that, when executed by the one or more processors, further cause the one or more processors to collect in a phase during which the sequence of RF pulses are not being applied to the subject;

build an echo-in signal matrix based on k-space sampling locations;

build an echo-out signal matrix based on the k-space sampling locations;

sum the echo-in signal matrix with the echo-out signal matrix to create a system matrix that models overlapping echoes; and reconstruct a MRI image and/or rate map based on the system matrix, and the collected plurality of echo signals.

Aspect 19. The computer system of aspect 18, wherein the one or more memories including computer executable instructions stored therein that, when executed by the one or more processors, further cause the one or more processors to:

control the gradient coil to apply the gradient magnetic field to the subject; and control the RF transmit coil to apply the sequence of RF pulses.

Aspect 20. The computer system of aspect 18, wherein:
the MRI image and/or rate map are included in a plurality
of MRI images and/or a plurality of rate maps; and
the plurality of MRI images and/or plurality of rate maps
are reconstructed further by splitting time windows of
the collected plurality of echo signals.
Aspect 21. The computer system of aspect 18, wherein:
the MRI image and/or rate map are included in a plurality
of MRI images and/or a plurality of rate maps; and
the plurality of MRI images and/or plurality of rate maps
are reconstructed further by applying an unaliasing by
Fourier-encoding the overlaps in the temporal dimen-
sion (UNFOLD) technique to the collected plurality of
echo signals.
Aspect 22. The computer system of aspect 18, wherein:
(i) the sum of the echo-in signal matrix with the echo-out
signal matrix to create the system matrix that models
overlapping echoes, and (ii) the reconstruction of the
MRI image and/or rate map based on the system
matrix, and the collected plurality of echo signals form
a model-based method with overlapping signal model-
ing (MB-2) technique, thereby improving spatial reso-
lution.

Other Matters

Additionally, certain embodiments are described herein as
including logic or a number of routines, subroutines, appli-
cations, or instructions. These may constitute either software
(code embodied on a non-transitory, tangible machine-read-
able medium) or hardware. In hardware, the routines, etc.,
are tangible units capable of performing certain operations
and may be configured or arranged in a certain manner. In
example embodiments, one or more computer systems (e.g.,
a standalone, client or server computer system) or one or
more hardware modules of a computer system (e.g., a
processor or a group of processors) may be configured by
software (e.g., an application or application portion) as a
hardware module that operates to perform certain operations
as described herein.

In various embodiments, a hardware module may be
implemented mechanically or electronically. For example, a
hardware module may comprise dedicated circuitry or logic
that is permanently configured (e.g., as a special-purpose
processor, such as a field programmable gate array (FPGA)
or an application-specific integrated circuit (ASIC) to per-
form certain operations. A hardware module may also com-
prise programmable logic or circuitry (e.g., as encompassed
within a general-purpose processor or other programmable
processor) that is temporarily configured by software to
perform certain operations. It will be appreciated that the
decision to implement a hardware module mechanically, in
dedicated and permanently configured circuitry, or in tem-
porarily configured circuitry (e.g., configured by software)
may be driven by cost and time considerations.

Accordingly, the term "hardware module" should be
understood to encompass a tangible entity, be that an entity
that is physically constructed, permanently configured (e.g.,
hardwired), or temporarily configured (e.g., programmed) to
operate in a certain manner or to perform certain operations
described herein. Considering embodiments in which hard-
ware modules are temporarily configured (e.g., pro-
grammed), each of the hardware modules need not be
configured or instantiated at any one instance in time. For
example, where the hardware modules comprise a general-
purpose processor configured using software, the general-
purpose processor may be configured as respective different
hardware modules at different times. Software may accord-
ingly configure a processor, for example, to constitute a particular hardware module at one instance of time and to
constitute a different hardware module at a different instance
of time.

Hardware modules can provide information to, and
receive information from, other hardware modules. Accord-
ingly, the described hardware modules may be regarded as
being communicatively coupled. Where multiple of such
hardware modules exist contemporaneously, communica-
tions may be achieved through signal transmission (e.g.,
over appropriate circuits and buses) that connect the hard-
ware modules. In embodiments in which multiple hardware
modules are configured or instantiated at different times,
communications between such hardware modules may be
achieved, for example, through the storage and retrieval of
information in memory structures to which the multiple
hardware modules have access. For example, one hardware
module may perform an operation and store the output of
that operation in a memory device to which it is communi-
catively coupled. A further hardware module may then, at a
later time, access the memory device to retrieve and process
the stored output. Hardware modules may also initiate
communications with input or output devices, and can
operate on a resource (e.g., a collection of information).

The various operations of example methods described
herein may be performed, at least partially, by one or more
processors that are temporarily configured (e.g., by soft-
ware) or permanently configured to perform the relevant
operations. Whether temporarily or permanently configured,
such processors may constitute processor-implemented
modules that operate to perform one or more operations or
functions. The modules referred to herein may, in some
example embodiments, comprise processor-implemented
modules.

Similarly, the methods or routines described herein may
be at least partially processor-implemented. For example, at
least some of the operations of a method may be performed
by one or more processors or processor-implemented hard-
ware modules. The performance of certain of the operations
may be distributed among the one or more processors, not
only residing within a single machine, but deployed across
a number of machines. In some example embodiments, the
processor or processors may be located in a single location
(e.g., within a home environment, an office environment or
as a server farm), while in other embodiments the processors
may be distributed across a number of geographic locations.

Furthermore, the patent claims at the end of this patent
application are not intended to be construed under 35 U.S.C.
§ 112(f) unless traditional means-plus-function language is
expressly recited, such as "means for" or "step for" language
being explicitly recited in the claim(s). The systems and
methods described herein are directed to an improvement to
computer functionality, and improve the functioning of
conventional computers.

What is claimed:
1. A method for use in T*$_2$ weighted magnetic resonance
imaging (MRI) image reconstruction, the method compris-
ing:
collecting, via one or more processors, a plurality of echo
signals, the plurality of echo signals being created by a
MRI machine: (i) applying a gradient magnetic field to
a subject, and (ii) applying a sequence of radio fre-
quency (RF) pulses to the subject, wherein the plurality
of echo signals include at least one overlap between
echoes, and wherein the plurality of echo signals are
collected in a phase during which the sequence of RF
pulses are not being applied to the subject;

building, via the one or more processors, an echo-in signal matrix based on k-space sampling locations;

building, via the one or more processors, an echo-out signal matrix based on k-space sampling locations;

summing, via the one or more processors, the echo-in signal matrix with the echo-out signal matrix to create a system matrix that models overlapping echoes; and reconstructing, via the one or more processors, a MRI image and/or rate map based on the system matrix, and the collected plurality of echo signals to resolve the overlapping echoes modeled in the system matrix.

2. The method of claim 1, further comprising:

collecting, via the one or more processors, a free-induction-decay (FID) signal, the FID signal being a signal that is created by the MRI machine applying: (i) the gradient magnetic field to the subject, and (ii) the sequence of RF pulses to the subject, wherein the FID signal is collected in a phase during which the sequence of RF pulses are being applied to the subject; and building, via the one or more processors, a FID signal matrix based on the k-space sampling locations; and wherein the reconstruction of the MRI image and/or rate map is based further on the FID signal matrix, and or the collected FID signal.

3. The method of claim 1, wherein the reconstruction of the MRI image or rate map comprises reconstructing the rate map further based on a free-induction-decay (FID) signal.

4. The method of claim 1, further comprising:

calculating, via the one or more processors, a series of optimized flip angles by maximizing a sum of transverse plane signals wherein the applying the sequence of RF pulses to the subject comprises applying the sequence of RF pulses such that the sequence of RF pulses induces the series of optimized flip angles;

collecting, via the one or more processors, a free-induction-decay (FID) signal, the FID signal being a signal that is created by the MRI machine applying: (i) the gradient magnetic field to the subject, and (ii) the sequence of RF pulses to the subject, wherein the FID signal is collected in a phase during which the sequence of RF pulses are being applied to the subject; and building, via the one or more processors, a FID signal matrix based on the k-space sampling locations; and wherein the reconstruction of the MRI image and/or rate map is based further on the FID signal matrix, and/or the collected FID signal.

5. The method of claim 1, further comprising:

calculating, via the one or more processors, a shaped sequence of RF pulses for more constant spatial excitation, wherein the applying the sequence of RF pulses comprises applying the shaped sequence of RF pulses;

collecting, via the one or more processors, a free-induction-decay (FID) signal, the FID signal being a signal that is created by the MRI machine applying: (i) the gradient magnetic field to the subject, and (ii) the shaped sequence of RF pulses, wherein the FID signal is collected in a phase during which the shaped sequence of RF pulses are applied to the subject; and building, via the one or more processors, a FID signal matrix based on the k-space sampling locations; and wherein the reconstruction of the MRI image and/or rate map is based further on the FID signal matrix, a shaped excitation profile of the calculated shaped sequence of RF pulses, and/or the collected FID signal.

6. The method of claim 1, wherein:

the building of the echo-in signal matrix further comprises applying weights to at least one row of the echo-in signal matrix; and the building of the echo-out signal matrix further comprises applying weights to at least one row of the echo-out signal matrix.

7. The method of claim 1, wherein the reconstruction of the MRI image and/or rate map is done according to an argument of the minimum equation that takes the system matrix, and the collected plurality of echo signals as inputs.

8. The method of claim 1, wherein the reconstruction of the MRI image and/or rate map is done according to an argument of the minimum equation with weighted elements.

9. The method of claim 1, wherein the echo-in signal matrix, and the echo-out signal matrix are built according to the equation:

$$a_{lij} = \int b(\vec{r} - \vec{r}_j) c(\vec{r}) e^{-z(\vec{r}) t_{l,j}} e^{-i2\pi \vec{k}_l(t_{l,i}) \cdot \vec{r}} d\vec{r}$$

where:

l=1 builds the echo-in signal matrix;

l=2 builds the echo-out signal matrix;

b(•) is an object basis function;

$c(\vec{r})$ is a sensitivity map of a receiver coil;

$z(\vec{r})$ is a rate map; and $e^{-i2\pi \vec{k}_l(t_{l,i}) \cdot \vec{r}}$ denotes a non-uniform fast Fourier transform (NUFFT).

10. A device for use in T*$_2$ weighted magnetic resonance imaging (MRI) image reconstruction, the device comprising one or more processors configured to:

collect a plurality of echo signals, the plurality echo signals being a plurality of signals that are created by a MRI machine: (i) applying a gradient magnetic field to a subject, and (ii) applying a sequence of radio frequency (RF) pulses to the subject, wherein the plurality of echo signals include at least one overlap between echoes, and wherein the one or more processors are further configured to collect in a phase during which the sequence of RF pulses are not being applied to the subject;

build an echo-in signal matrix based on k-space sampling locations;

build an echo-out signal matrix based on the k-space sampling locations;

sum the echo-in signal matrix with the echo-out signal matrix to create a system matrix that models overlapping echoes; and reconstruct a MRI image and/or rate map based on the system matrix, and the collected plurality of echo signals to resolve the overlapping echoes modeled in the system matrix.

11. The device of claim 10, wherein the one or more processors are further configured to:

collect a free-induction-decay (FID) signal, the FID signal being a signal that is created by the MRI machine applying: (i) the gradient magnetic field to the subject, and (ii) the sequence of RF pulses to the subject, wherein the one or more processors are configured to collect the FID signal in a phase during which the sequence of RF pulses are applied to the subject; and build a FID signal matrix based on the k-space sampling locations; and wherein the reconstruction of the MRI image and/or rate map is based further on the FID signal matrix, and/or the collected FID signal.

12. The device of claim 10, wherein the one or more processors are further configured to reconstruct the rate map further based on a free-induction-decay (FID) signal.

13. The device of claim 10, wherein the one or more processors are further configured to:

calculate a series of optimized flip angles by maximizing a sum of transverse plane signals;

apply the sequence of RF pulses to the subject by applying the sequence of RF pulses such that the sequence of RF pulses induces the series of optimized flip angles;

collect a free-induction-decay (FID) signal, the FID signal being a signal that is created by the MRI machine applying: (i) the gradient magnetic field to the subject, and (ii) the sequence of RF pulses to the subject, wherein the one or more processors are configured to collect the FID signal in a phase during which the sequence of RF pulses are applied to the subject; and build a FID signal matrix based on the k-space sampling locations; and wherein the reconstruction of the MRI image and/or rate map is based further on the FID signal matrix, and/or the collected FID signal.

14. The device of claim 10, wherein the one or more processors are further configured to:

calculate a shaped RF pulse for more constant spatial excitation;

collect a free-induction-decay (FID) signal, the FID signal being a signal that is created by the MRI machine applying: (i) the gradient magnetic field to the subject, and (ii) the shaped RF pulse; and build a FID signal matrix based on the k-space sampling locations; and wherein the reconstruction of the MRI image and/or rate map is based further on the FID signal matrix, a shaped excitation profile of the calculated shaped sequence of RF pulses, and/or the collected FID signal.

15. The device of claim 10, wherein the one or more processors are further configured to:

build the echo-in signal matrix further by applying weights to at least one row of the echo-in signal matrix; and build the echo-out signal matrix further by applying weights to at least one row of the echo-out signal matrix.

16. The device of claim 10, wherein the one or more processors are further configured to reconstruct the MRI image and/or rate map according to an argument of the minimum equation that takes the system matrix as an input.

17. The device of claim 10, wherein the one or more processors are further configured to reconstruct the MRI image and/or rate map according to an argument of the minimum equation with weighted elements.

18. A magnetic resonance imaging (MRI) system for use in T*$_2$ weighted MRI image reconstruction, the MRI system comprising:

one or more processors;

a gradient coil;

at least one radio frequency (RF) transmit coil;

at least one RF receive coil; and one or more memories coupled to the one or more processors;

the one or more memories including computer executable instructions stored therein that, when executed by the one or more processors, cause the one or more processors to:

collect a plurality of echo signals, the plurality of echo signals being a plurality of signals that are created by the MRI system: (i) applying a gradient magnetic field to a subject, and (ii) applying a sequence of RF pulses to the subject, wherein the plurality of echo signals include at least one overlap between echoes, and wherein the one or more memories including computer executable instructions stored therein that, when executed by the one or more processors, further cause the one or more processors to collect in a phase during which the sequence of RF pulses are not being applied to the subject;

build an echo-in signal matrix based on k-space sampling locations;

build an echo-out signal matrix based on the k-space sampling locations;

sum the echo-in signal matrix with the echo-out signal matrix to create a system matrix that models overlapping echoes; and reconstruct a MRI image and/or rate map based on the system matrix, and the collected plurality of echo signals to resolve the overlapping echoes modeled in the system matrix.

19. The MRI system of claim 18, wherein the one or more memories including computer executable instructions stored therein that, when executed by the one or more processors, further cause the one or more processors to:

control the gradient coil to apply the gradient magnetic field to the subject; and control the RF transmit coil to apply the sequence of RF pulses including shaping the RF pulsed by placing a constraint on an amplitude of the RF pulses.

20. The MRI system of claim 18, wherein:

the MRI image and/or rate map are included in a plurality of MRI images and/or a plurality of rate maps; and the plurality of MRI images and/or plurality of rate maps are reconstructed further by splitting time windows of the collected plurality of echo signals.

21. The MRI system of claim 18, wherein:

the MRI image and/or rate map are included in a plurality of MRI images and/or a plurality of rate maps; and the plurality of MRI images and/or plurality of rate maps are reconstructed further by applying an unaliasing by Fourier-encoding the overlaps in the temporal dimension (UNFOLD) technique to the collected plurality of echo signals.

22. The MRI system of claim 18, wherein:

(i) the sum of the echo-in signal matrix with the echo-out signal matrix to create the system matrix that models overlapping echoes, and (ii) the reconstruction of the MRI image and/or rate map based on the system matrix, and the collected plurality of echo signals form a model-based method with overlapping signal modeling (MB-2) technique, thereby improving spatial resolution.

* * * * *